United States Patent
Chuc et al.

(10) Patent No.: US 8,894,767 B2
(45) Date of Patent: Nov. 25, 2014

(54) FLOW CONTROL FEATURES OF CVD CHAMBERS

(75) Inventors: Kien N. Chuc, Cupertino, CA (US); Qiwei Liang, Fremont, CA (US); Hanh D. Nguyen, San Jose, CA (US); Xinglong Chen, San Jose, CA (US); Matthew Miller, Newark, CA (US); Soonam Park, Mountain View, CA (US); Toan Q. Tran, San Jose, CA (US); Adib Khan, Santa Clara, CA (US); Jang-Gyoo Yang, San Jose, CA (US); Dmitry Lubomirsky, Cupertino, CA (US); Shankar Venkataraman, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 962 days.

(21) Appl. No.: 12/836,726

(22) Filed: Jul. 15, 2010

(65) Prior Publication Data

US 2011/0011338 A1    Jan. 20, 2011

Related U.S. Application Data

(60) Provisional application No. 61/225,890, filed on Jul. 15, 2009, provisional application No. 61/233,706, filed on Aug. 13, 2009, provisional application No. 61/234,120, filed on Aug. 14, 2009.

(51) Int. Cl.
| | | |
|---|---|---|
| C23C 16/00 | (2006.01) | |
| C23F 1/00 | (2006.01) | |
| C23C 16/455 | (2006.01) | |
| H01J 37/32 | (2006.01) | |
| C23C 16/452 | (2006.01) | |

(52) U.S. Cl.
CPC ..... *C23C 16/45565* (2013.01); *C23C 16/45574* (2013.01); *H01J 37/3244* (2013.01); *H01J 37/32449* (2013.01); *C23C 16/452* (2013.01)
USPC ..................................... 118/715; 156/345.34

(58) Field of Classification Search
CPC ... C23C 16/45565; C23C 16/45574–16/45576
USPC .......................................... 156/345.34, 345.33
See application file for complete search history.

(56) References Cited

U.S. PATENT DOCUMENTS 5,074,456 A * 12/1991 Degner et al. .................. 228/121
6,126,753 A * 10/2000 Shinriki et al. ................ 118/715
(Continued)

FOREIGN PATENT DOCUMENTS

CN    1754008A A    3/2006
CN    101326629A A    12/2008
(Continued)

OTHER PUBLICATIONS

PCT International search report and written opinion of PCT/US2010/042194 dated Feb. 7, 2011.
(Continued)

*Primary Examiner* — Gordon R Baldwin
*Assistant Examiner* — Charlee Bennett
(74) *Attorney, Agent, or Firm* — Patterson & Sheridan, LLP

(57) ABSTRACT

Apparatus and methods for gas distribution assemblies are provided. In one aspect, a gas distribution assembly is provided comprising an annular body comprising an annular ring having an inner annular wall, an outer wall, an upper surface, and a bottom surface, an upper recess formed into the upper surface, and a seat formed into the inner annular wall, an upper plate positioned in the upper recess, comprising a disk-shaped body having a plurality of first apertures formed therethrough, and a bottom plate positioned on the seat, comprising a disk-shaped body having a plurality of second apertures formed therethrough which align with the first apertures, and a plurality of third apertures formed between the second apertures and through the bottom plate, the bottom plate sealingly coupled to the upper plate to fluidly isolate the plurality of first and second apertures from the plurality of third apertures.

16 Claims, 22 Drawing Sheets

(56) References Cited

U.S. PATENT DOCUMENTS

| | | | |
|---|---|---|---|
| 6,302,964 B1* | 10/2001 | Umotoy et al. | 118/715 |
| 6,818,096 B2* | 11/2004 | Barnes et al. | 156/345.43 |
| 6,983,892 B2* | 1/2006 | Noorbakhsh et al. | 239/67 |
| 7,354,622 B2* | 4/2008 | Shinriki et al. | 427/252 |
| 7,846,264 B2* | 12/2010 | Wang et al. | 134/26 |
| 8,617,349 B2* | 12/2013 | Law et al. | 118/715 |
| 2002/0142572 A1 | 10/2002 | Sakamoto et al. | |
| 2003/0019428 A1* | 1/2003 | Ku et al. | 118/715 |
| 2003/0019580 A1* | 1/2003 | Strang | 156/345.33 |
| 2004/0050492 A1* | 3/2004 | Tsuei et al. | 156/345.33 |
| 2005/0011447 A1* | 1/2005 | Fink | 118/715 |
| 2005/0145338 A1* | 7/2005 | Park et al. | 156/345.34 |
| 2005/0241579 A1* | 11/2005 | Kidd | 118/715 |
| 2006/0090850 A1* | 5/2006 | Laflamme et al. | 156/345.33 |
| 2006/0191481 A1 | 8/2006 | Sakamoto et al. | |
| 2006/0266852 A1* | 11/2006 | Choi | 239/548 |
| 2007/0277734 A1* | 12/2007 | Lubomirsky et al. | 118/715 |
| 2008/0099147 A1* | 5/2008 | Myo et al. | 118/715 |
| 2009/0280650 A1 | 11/2009 | Lubomirsky et al. | |
| 2010/0276084 A1* | 11/2010 | Yao | 156/345.34 |
| 2012/0222815 A1* | 9/2012 | Sabri et al. | 156/345.34 |
| 2012/0258259 A1* | 10/2012 | Bansal et al. | 427/558 |
| 2013/0280914 A1* | 10/2013 | Dhindsa | 438/710 |
| 2014/0113084 A1* | 4/2014 | Nguyen et al. | 427/585 |

FOREIGN PATENT DOCUMENTS

| | | |
|---|---|---|
| CN | 101454482A A | 6/2009 |
| JP | 2002294454 A | 10/2002 |
| JP | 2003529926 A | 10/2003 |
| JP | 2005019606 A | 1/2005 |
| JP | 2005-317958 A | 11/2005 |
| JP | 2007324154 A | 12/2007 |
| JP | 2009141343 A | 6/2009 |
| JP | 2009539269 A | 11/2009 |
| WO | 2007/140426 A2 | 12/2007 |
| WO | WO-2009137272 A2 | 11/2009 |

OTHER PUBLICATIONS

China Office Action Application No. 2010800319197 dated Aug. 26, 2014.

Japan Office Action Application No. 2012-0520801 dated Sep. 2, 2014.

* cited by examiner

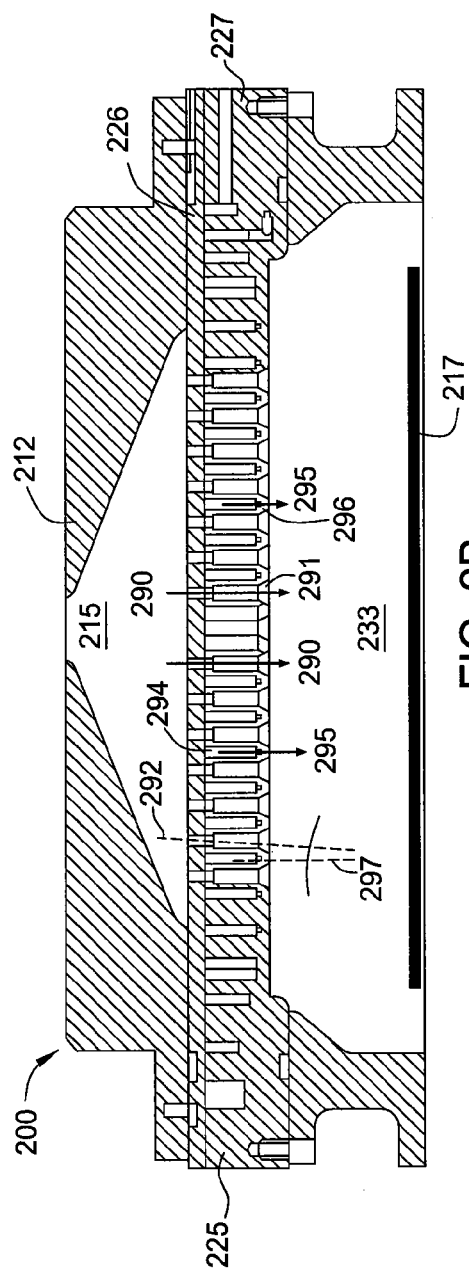
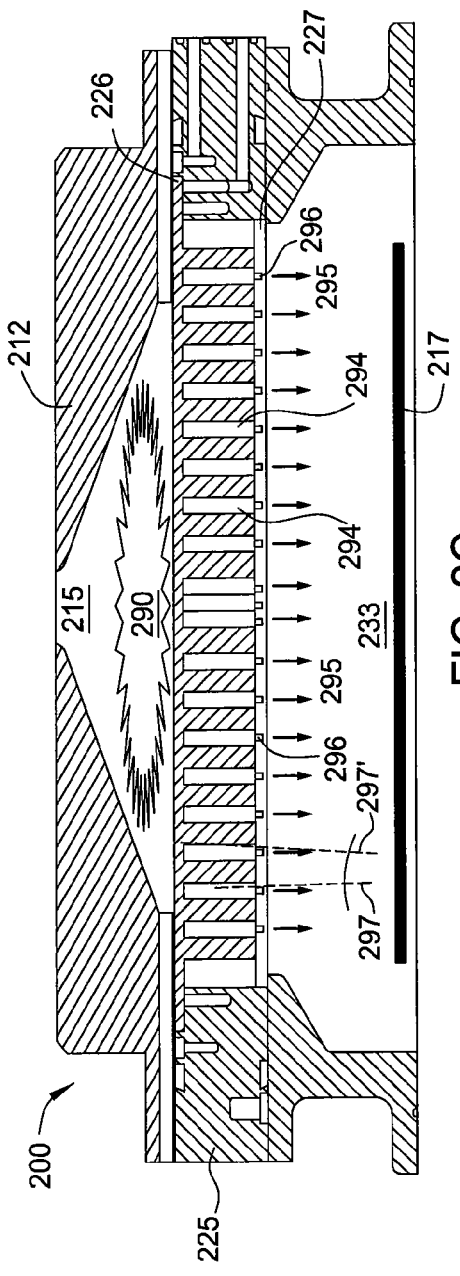

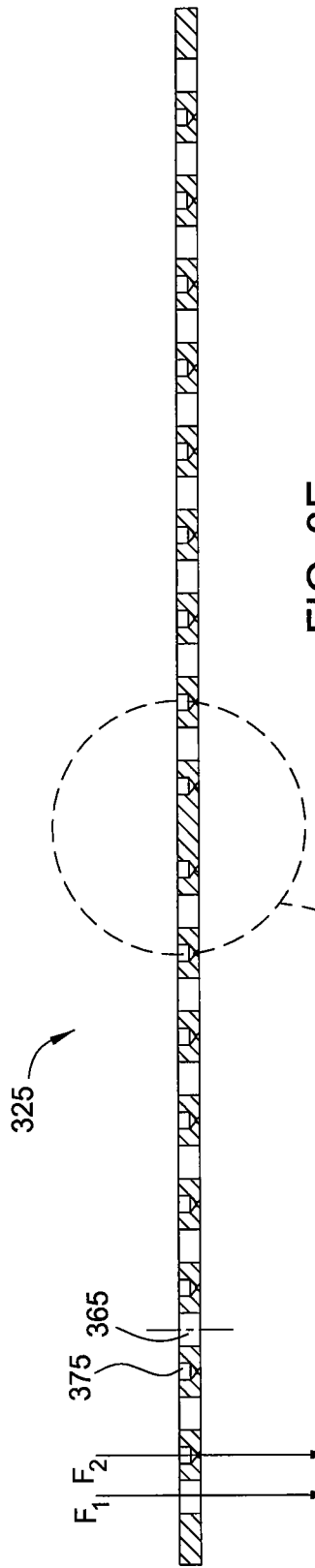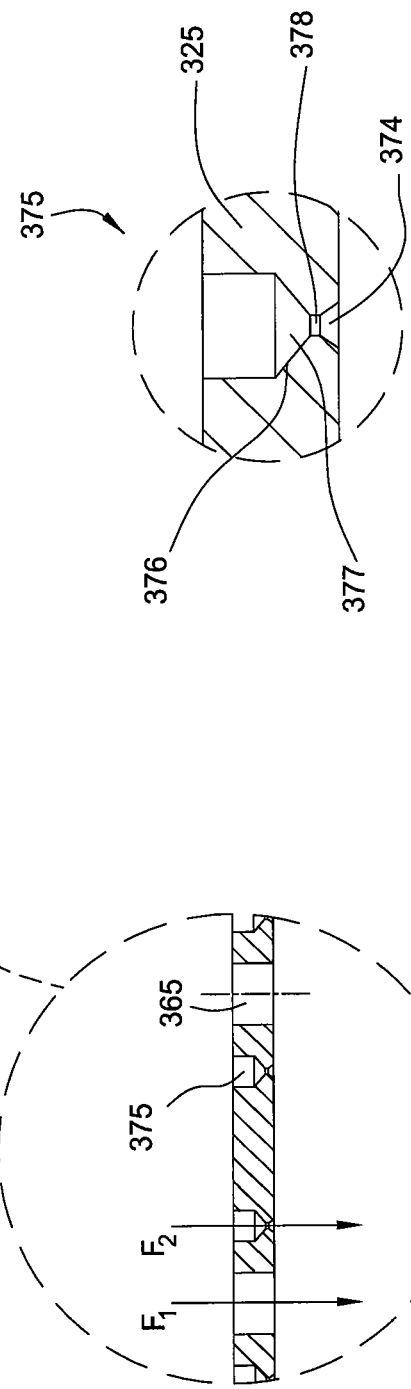
FIG. 3E
FIG. 3F
FIG. 3G

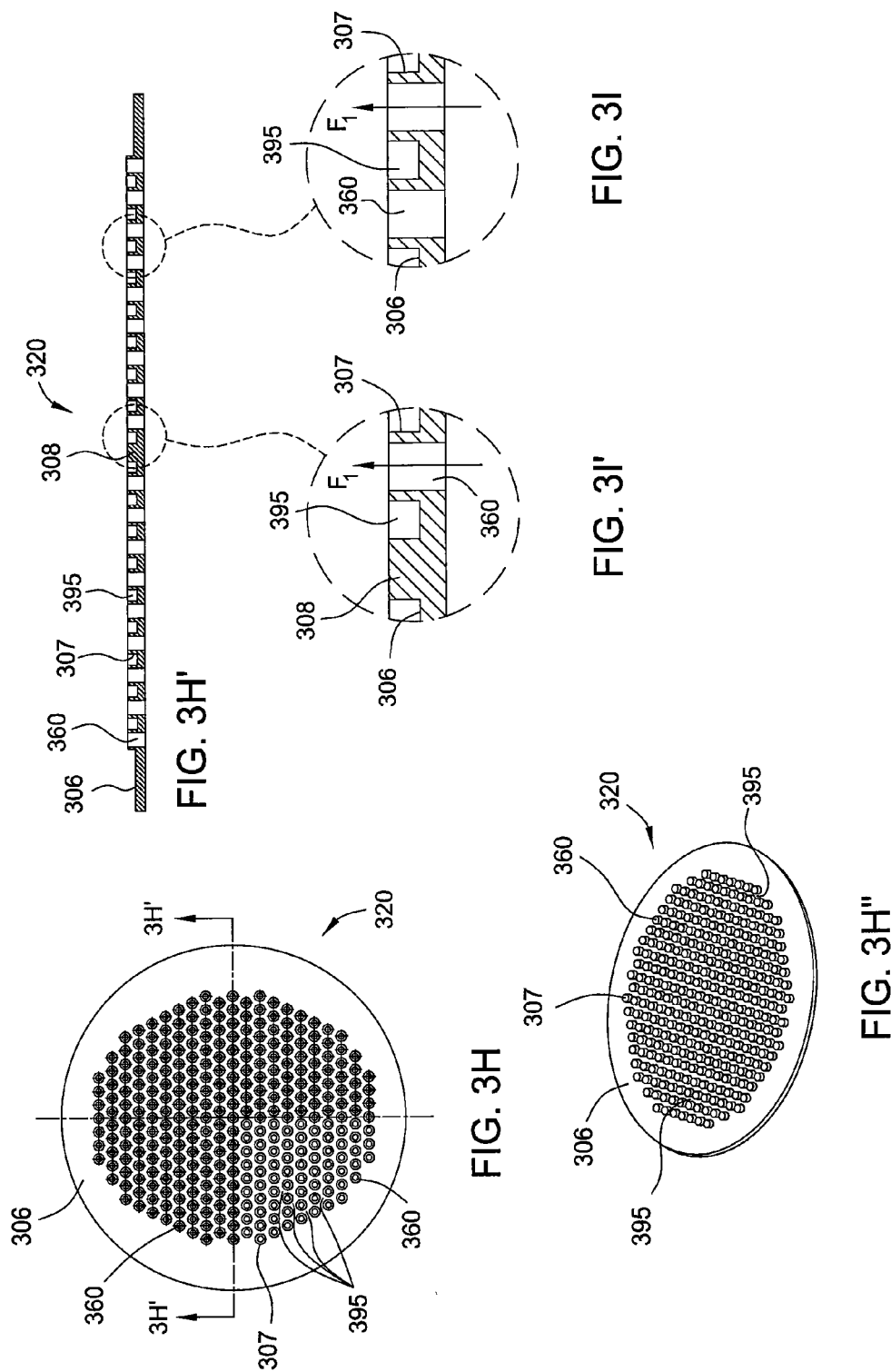

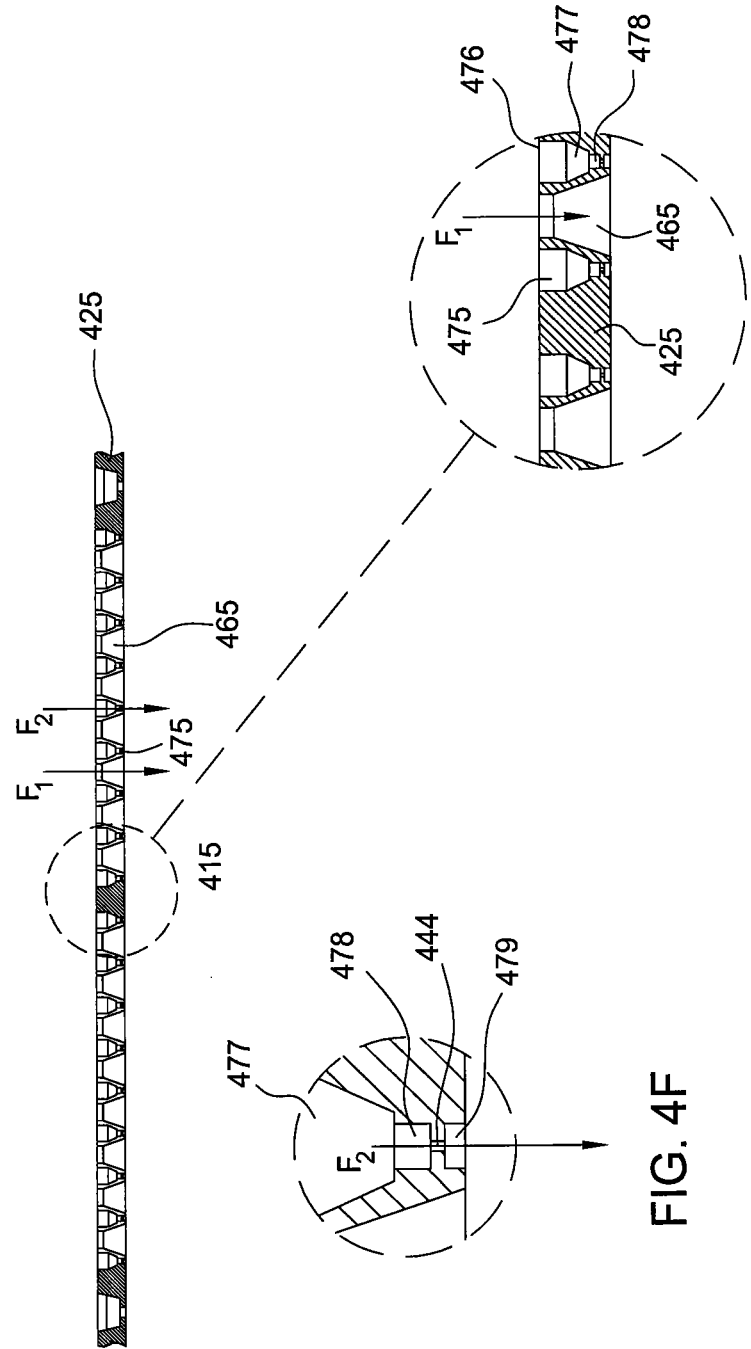

FLOW CONTROL FEATURES OF CVD CHAMBERS

CROSS-REFERENCE TO RELATED APPLICATIONS

This application claims priority to U.S. Provisional Patent Application Ser. No. 61/225,890 filed Jul. 15, 2009, U.S. Provisional Patent Application Ser. No. 61/233,706 filed Aug. 13, 2009, and U.S. Provisional Patent Application Ser. No. 61/234,120 filed Aug. 14, 2009, all of which are herein incorporated by reference.

BACKGROUND OF THE INVENTION

1. Field of the Invention

The invention relates to an apparatus for processing substrates, such as semiconductor substrates, and more particularly, to an apparatus for distribution of process fluids over a substrate.

2. Description of the Related Art

Semiconductor processing systems generally include a process chamber having a pedestal for supporting a substrate, such as a semiconductor substrate, within the chamber proximate a processing region. The chamber forms a vacuum enclosure defining, in part, the processing region. A gas distribution assembly or showerhead provides one or more process gases to the processing region. The gases are then heated and/or energized to form a plasma which performs certain processes upon the substrate. These processes may include deposition processes, such as chemical vapor deposition (CVD), to deposit a material on the substrate or an etch reaction to remove material from the substrate, among other processes.

In processes that require multiple gases, the gases may be combined within a mixing chamber that is then coupled to the gas distribution assembly via a conduit. For example, in a conventional thermal CVD process, two process gases are supplied to a mixing chamber along with two respective carrier gases where they are combined to form a gaseous mixture. The gaseous mixture may be introduced directly to the chamber, or may travel through a conduit within an upper portion of the chamber to the distribution assembly. The distribution assembly generally includes a plate having a plurality of holes such that the gaseous mixture is evenly distributed into the processing region above the substrate. In another example, two gases pass through the distribution assembly separately, and are allowed to combine before reaching the processing region and/or the substrate. As the gaseous mixture enters the processing region and is infused with thermal energy, a chemical reaction occurs between the process gases, resulting in a chemical vapor deposition reaction on the substrate.

Although it is generally advantageous to mix the gases prior to release into the processing region, for example, to ensure that the component gases are uniformly distributed into the processing region, the gases tend to begin reduction, or otherwise react, within the mixing chamber or distribution plate. Consequently, deposition on or etching of the mixing chamber, conduits, distribution plate, and other chamber components may result prior to the gaseous mixture reaching the processing region. Additionally, reaction by-products may accumulate in the chamber gas delivery components or on the inside surface of the distribution plate, thus generating, and/or increasing the presence of, unwanted particles.

Temperature control of the gases as they are released into the processing region is advantageous for controlling the reactivity of the gases. For example, cooling the gases can be helpful in controlling unwanted reactions prior to release into the processing region. The gases refrain from reacting until they come into contact with a heated substrate. In other circumstances, heating of gases may be necessary. For example, hot gas purging or cleaning may help remove contaminants from a processing chamber. Thus, integrating a temperature control aspect into a gas distribution plate is useful.

Therefore, there is a continuing need for a gas distribution device that delivers at least two gases into a processing region without co-mingling of the gases prior to reaching the processing region.

SUMMARY OF THE INVENTION

Aspects described herein relate to an apparatus for delivering process fluids, such as gases, to a processing chamber for deposition of a film on a substrate, or other processes. In one aspect, a gas distribution assembly, comprising a first manifold having a plurality of first apertures formed therethrough for passage of a first fluid and the first manifold defining a flow path for a second fluid, and a second manifold with a top side coupled to the first manifold and isolating the flow path from the first fluid, and the second manifold having a plurality of second apertures with each of the second apertures coupled to one of the first apertures, and a plurality of third apertures fluidly coupled to the flow path is provided.

In another aspect, a gas distribution assembly, comprising an upper manifold comprising a plurality of first apertures formed in a plurality of first radial rows concentrically disposed around a center portion of the upper manifold, and a plurality of second apertures concentrically disposed around the plurality of first apertures and formed in a plurality of second radial rows, a center manifold coupled to the upper manifold comprising, a set of first openings concentrically disposed around a center portion of the center manifold, and a set of second openings concentrically disposed around the first set of first openings, and a bottom manifold coupled to the center manifold comprising a set of third openings concentrically disposed around a center portion of the bottom manifold, a set of fourth openings concentrically disposed around the set of third openings, a plurality of first gas channels disposed between each of the fourth openings on the upper side of the bottom manifold, and a channel network disposed concentrically around the set of fourth openings and fluidly coupled to one or more of the first gas channels is provided.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments. Nonetheless, the teachings of the present invention can be readily understood by considering the following detailed description in conjunction with the accompanying drawings, in which:

FIGS. 2A-2C are schematic cross-sectional views of one embodiment of a processing chamber;

FIG. 3A-3M are schematic views of one embodiment of a gas distribution assembly as described herein;

FIG. 4A-4I are schematic views of one embodiment of a gas distribution assembly as described herein;

To facilitate understanding, identical reference numerals have been used, where possible, to designate identical elements that are common to the figures. It is also contemplated that elements disclosed in one embodiment may be beneficially utilized on other embodiments without specific recitation.

DETAILED DESCRIPTION

Aspects described herein relate to an apparatus for delivering process fluids to a processing chamber for deposition of a film on a substrate or other processes.

Figure 1:
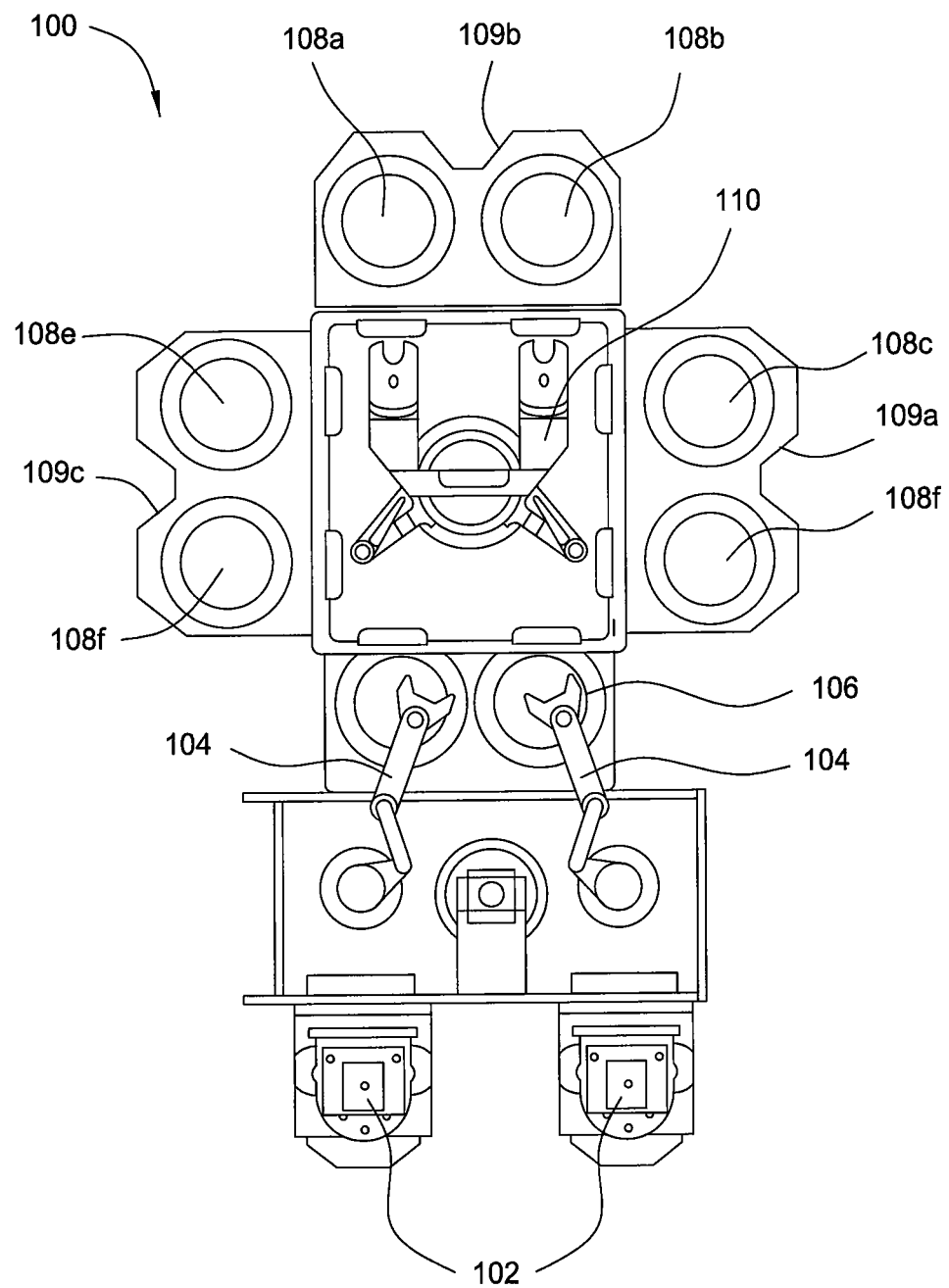
FIG. 1 is a top plan view of one embodiment of a processing tool.

FIG. 1 is a top plan view of one embodiment of a processing tool 100 of deposition, baking and curing chambers according to disclosed embodiments. In the figure, a pair of FOUPs (front opening unified pods) 102 supply substrate substrates (e.g., 300 mm diameter substrates) that are received by robotic arms 104 and placed into a low pressure holding area 106 before being placed into one of the substrate processing sections 108a-f of the tandem process chambers 109a-c. A second robotic arm 110 may be used to transport the substrate substrates from the holding area 106 to the processing chambers 108a-f and back.

The substrate processing sections 108a-f of the tandem process chambers 109a-c may include one or more system components for depositing, annealing, curing and/or etching a flowable dielectric film on the substrate. In one configuration, two pairs of the tandem processing sections of the processing chamber (e.g., 108c-d and 108e-f) may be used to deposit the flowable dielectric material on the substrate, and the third pair of tandem processing sections (e.g., 108a-b) may be used to anneal the deposited dielectric. In another configuration, the two pairs of the tandem processing sections of processing chambers (e.g., 108c-d and 108e-f) may be configured to both deposit and anneal a flowable dielectric film on the substrate, while the third pair of tandem processing sections (e.g., 108a-b) may be used for UV or E-beam curing of the deposited film. In still another configuration, all three pairs of tandem processing sections (e.g., 108a-f) may be configured to deposit and cure a flowable dielectric film on the substrate.

In yet another configuration, two pairs of tandem processing sections (e.g., 108c-d and 108e-f) may be used for both deposition and UV or E-beam curing of the flowable dielectric, while a third pair of tandem processing sections (e.g. 108a-b) may be used for annealing the dielectric film. It will be appreciated, that additional configurations of deposition, annealing and curing chambers for flowable dielectric films are contemplated by system 100.

In addition, one or more of the tandem processing sections 108a-f may be configured as a wet treatment chamber. These process chambers include heating the flowable dielectric film in an atmosphere that includes moisture. Thus, embodiments of system 100 may include wet treatment tandem processing sections 108a-b and anneal tandem processing sections 108c-d to perform both wet and dry anneals on the deposited dielectric film.

Figure 2A:
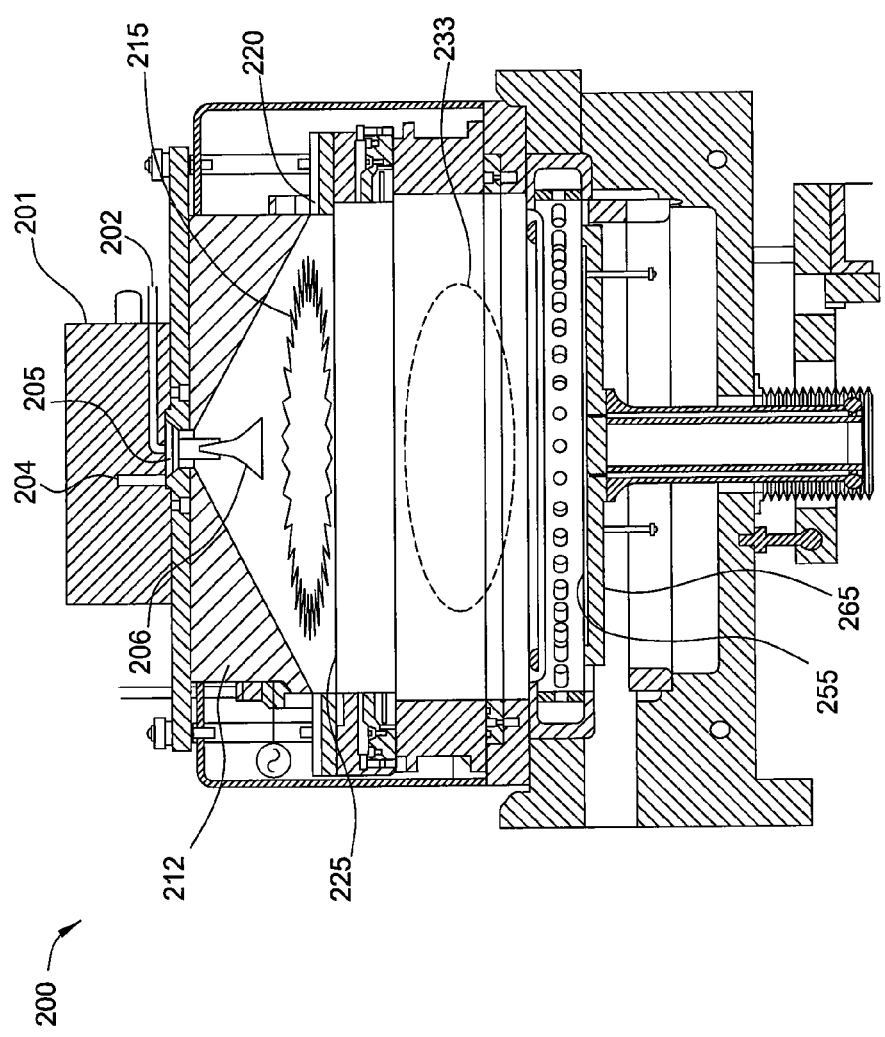

FIG. 2A is a cross-sectional view of one embodiment of a process chamber section 200 with partitioned plasma generation regions within the tandem processing chambers. During film deposition (silicon oxide, silicon nitride, silicon oxynitride or silicon oxycarbide), a process gas may be flowed into the first plasma region 215 through a gas inlet assembly 205. The process gas may be excited prior to entering the first plasma region 215 within a remote plasma system (RPS) 201. A lid 212, a showerhead 225, and a substrate support 265, having a substrate 255 disposed thereon, are shown according to disclosed embodiments. The 212 may be pyramidal, conical, or other similar structure with a narrow top portion expanding to a wide bottom portion. The lid 212 is depicted with an applied AC voltage source and the showerhead is grounded, consistent with plasma generation in the first plasma region 215. An insulating ring 220 is positioned between the lid 212 and the showerhead 225 enabling a capacitively coupled plasma (CCP) to be formed in the first plasma region.

The lid 212 may be a dual-source lid for use with a processing chamber according to disclosed embodiments. A fluid inlet assembly 205 introduces a fluid, such as a gas, into the first plasma region 215. Two distinct fluid supply channels are visible within the fluid inlet assembly 205. A first channel 202 carries a fluid, such as a gas, that passes through the remote plasma system RPS 201, while a second channel 204 has a fluid, such as a gas, that bypasses the RPS 201. The first channel 202 may be used for the process gas and the second channel 204 may be used for a treatment gas in disclosed embodiments. The gases may flow into the plasma region 215 and be dispersed by a baffle 206. The lid 205 and showerhead 225 are shown with an insulating ring 220 in between, which allows an AC potential to be applied to the lid 212 relative to the showerhead 225.

A fluid, such as a precursor, for example a silicon-containing precursor, may be flowed into the second plasma region by embodiments of the showerhead described herein. Excited species derived from the process gas in the plasma region 215 travel through apertures in the showerhead 225 and react with the precursor flowing into the second plasma region 233 from the showerhead. Little or no plasma is present in the second plasma region 233. Excited derivatives of the process gas and the precursor combine in the region above the substrate and, on occasion, on the substrate to form a flowable film on the substrate. As the film grows, more recently added material possesses a higher mobility than underlying material. Mobility decreases as organic content is reduced by evaporation. Gaps may be filled by the flowable film using this technique without leaving traditional densities of organic content within the film after deposition is completed. A curing step may still be used to further reduce or remove the organic content from a deposited film.

Exciting the process gas in the first plasma region 215 directly, exciting the process gas in the remote plasma system (RPS), or both provides several benefits. The concentration of the excited species derived from the process gas may be increased within the second plasma region 233 due to the plasma in the first plasma region 215. This increase may result from the location of the plasma in the first plasma region 215. The second plasma region 233 is located closer to the first plasma region 215 than the remote plasma system (RPS) 201, leaving less time for the excited species to leave excited states through collisions with other gas molecules, walls of the chamber and surfaces of the showerhead.

The uniformity of the concentration of the excited species derived from the process gas may also be increased within the second plasma region 233. This may result from the shape of the first plasma region 215, which is more similar to the shape of the second plasma region 233. Excited species created in the remote plasma system (RPS) 201 travel greater distances in order to pass through apertures near the edges of the showererhead 225 relative to species that pass through apertures near the center of the showerhead 225. The greater distance results in a reduced excitation of the excited species and, for example, may result in a slower growth rate near the edge of a substrate. Exciting the process gas in the first plasma region 215 mitigates this variation.

Preferably, the processing gas is excited in the RPS 201 and is passed through the showerhead 225 to the second plasma region 233 in the excited state. Alternatively, power may be applied to the first processing region to either excite a plasma gas or enhance and already exited process gas from the RPS. While a plasma may be generated in the second plasma region 233, one preferred embodiment of the process, a plasma is not generated in the second plasma region. In one preferred embodiment of a process, the only excitation of the processing gas or precursors is from exciting the processing gas in the RPS 201 to reaction with the precursors in the second plasma region 233.

The processing chamber and tool are more fully described in patent application Ser. No. 12/210,940 filed on Sep. 15, 2008, and patent application Ser. No. 12/210,982 filed on Sep. 15, 2008, which are incorporated herein by reference to the extent not inconsistent with the claimed aspects and description herein.

FIGS. 2B-2C are side schematic views of one embodiment of the precursor flow processes in the processing chambers and the gas distribution assemblies described herein. The gas distribution assemblies for use in the processing chamber section 200 are referred to as dual zone showerheads (DZSH) and are detailed in the embodiments described in FIGS. 3A-3K, 4A-4I, and 5A-5F herein. The following gas flow description is directed towards a broad dual zone showerhead description and should not be interpreted or construed as limiting the showerhead aspects described herein. While the following description is described with the deposition of dielectric materials, the inventors contemplate that this apparatus and methods may be used to deposit other materials.

In a one embodiment of a deposition process, the dual zone showerhead allows for flowable deposition of a dielectric material. Examples of dielectric materials that may be deposited in the processing chamber include silicon oxide, silicon nitride, silicon oxycarbide, or silicon oxynitride. Silicon nitrides materials include silicon nitride, $Si_xN_y$, hydrogen-containing silicon nitrides, $Si_xN_yH_z$, silicon oxynitrides, including hydrogen-containing silicon oxynitrides, $Si_xN_yH_zO_{zz}$, and halogen-containing silicon nitrides, including chlorinated silicon nitrides, $Si_xN_yH_zCl_{zz}$. The deposited dielectric material may then be converted to a silicon oxide like material.

The dielectric layer can be deposited by introducing dielectric material precursors and reacting the precursors with a processing gas in the second plasma region 233, or reaction volume. Examples of precursors are silicon-containing precursors including silane, disilane, methylsilane, dimethylsilane, trimethylsilane, tetramethylsilane, tetraethoxysilane (TEOS), triethoxysilane (TES), octamethylcyclotetrasiloxane (OMCTS), tetramethyl-disiloxane (TMDSO), tetramethylcyclotetrasiloxane (TMCTS), tetramethyl-diethoxyl-disiloxane (TMDDSO), dimethyl-dimethoxyl-silane (DMDMS) or combinations thereof. Additional precursors for the deposition of silicon nitride include $Si_xN_yH_z$— containing precursors, such as sillyl-amine and its derivatives including trisillylamine (TSA) and disillylamine (DSA), $Si_xN_yH_zO_{zz}$— containing precursors, $Si_xN_yH_zCl_{zz}$— containing precursors, or combinations thereof.

Processing gases include hydrogen-containing compounds, oxygen-containing compounds, nitrogen-containing compounds, or combinations thereof. Examples of suitable processing gases include one or more of compounds selected from the group comprising of $H_2$, a $H_2/N_2$ mixture, $NH_3$, $NH_4OH$, $O_3$, $O_2$, $H_2O_2$, $N_2$, $N_xH_y$ compounds including $N_2H_4$ vapor, NO, $N_2O$, $NO_2$, water vapor, or combinations thereof. The processing gas may be plasma exited, such as in the RPS unit, to include N* and/or H* and/or O*-containing radicals or plasma, for example, $NH_3$, $NH_2$*, NH*, N*, H*, O*, N*O*, or combinations thereof. The process gas may alternatively, include one or more of the precursors described herein.

The precursors are introduced into reaction zone by first being introduced into an internal showerhead volume 294 defined in the showerhead 225 by a first manifold 226, or upper plate, and second manifold 227, or bottom plate. The precursors in the internal showerhead volume 294 flow 295 into the processing region 233 via apertures 296 (openings) formed in the second manifold. This flow path is isolated from the rest of the process gases in the chamber, and provides for the precursors to be in an unreacted or substantially unreacted state until entry into the processing region 233 defined between the substrate 217 and a bottom of the second manifold 227. Once in the processing region 233, the precursor may react with a processing gas. The precursor may be introduced into the internal showerhead volume 294 defined in the showerhead 225 through a side channel formed in the showerhead, such as channels 490, 518, and/or 539 as shown in the showerhead embodiments herein. The process gas may be in a plasma state including radicals from the RPS unit or from a plasma generated in the first plasma region. Additionally, a plasma may be generated in the second plasma region.

Processing gases may be provided into the first plasma region 215, or upper volume, defined by the lid 212 and the top of the showerhead 225. Distribution of the processing gas may be achieved by use of a baffle 206 as shown in FIG. 2A. The processing gas may be plasma excited in the first plasma region 215 to produce process gas plasma and radicals including N* and/or H* and/or O* containing radicals or plasma, for example, $NH_3$, $NH_2$*, NH*, N*, H*, O*, N*O*, or combinations thereof. Alternatively, the processing gas may already be in a plasma state after passing through a remote plasma system prior to introduction to the first plasma processing region 215.

The processing gas 290 including plasma and radicals is then delivered to the processing region 233 for reaction with the precursors though apertures, such as channels 290. The processing gasses passing though the channels are physically isolated from the internal showerhead volume 294 and do not react with the precursors passing through the internal showerhead volume 294 as both the processing gas and the precursors pass through the showerhead 225. Once in the processing volume, the processing gas and precursors may mix and react to deposit the dielectric materials.

In addition to the process gas and a dielectric material precursor there may be other gases introduced at varied times for varied purposes. A treatment gas may be introduced to remove unwanted species from the chamber walls, the substrate, the deposited film and/or the film during deposition, such as hydrogen, carbon, and fluorine. A process gas and/or treatment gas may comprise at least one of the gases from the group: $H_2$, a $H_2/N_2$ mixture, $NH_3$, $NH_4OH$, $O_3$, $O_2$, $H_2O_2$, $N_2$, $N_2H_4$ vapor, NO, $N_2O$, $NO_2$, water vapor, or combinations thereof. A treatment gas may be excited in a plasma and then used to reduce or remove a residual organic content from the deposited film. In other disclosed embodiments the treatment gas may be used without a plasma. When the treatment gas includes water vapor, the delivery may be achieved using a mass flow meter (MFM) and injection valve or by commercially available water vapor generators. The treatment gas may be introduced from into the first processing region, either through the RPS unit or bypassing the RPS unit, and may further be excited in the first plasma region.

The axis 292 of the opening of apertures 291 and the axis 297 of the opening of apertures 296 may be parallel or substantially parallel to one another. Alternatively, the axis 292 and axis 297 may be angled from each other, such as from 1° to 80°, for example, from 1° to 30°. Alternatively, each of the respective axis 292 may be angled from each other, such as from 1° to 80°, for example, from 1° to 30°, and each of the respective axis 297 may be angled from each other, such as from 1° to 80°, for example, from 1° to 30°.

The respective openings may be angled, such as shown for aperture 291 in FIG. 2B, with the opening having an angle from 1° to 80°, such as from 1° to 30°. The axis 292 of the opening of apertures 291 and the axis 297 of the opening of apertures 296 may be perpendicular or substantially perpendicular to the surface of the substrate 217. Alternatively, the axis 292 and axis 297 may be angled from the substrate surface, such as less than 5°.

FIG. 2C illustrates a partial schematic view of the processing chamber 200 and showerhead 225 illustrating the precursor flow 295 from the internal volume 294 through apertures 296 into the processing region 233. The figure also illustrates an alternative embodiment showing axis 297 and 297' of two apertures 296 being angled from one another.

Figure 3A:
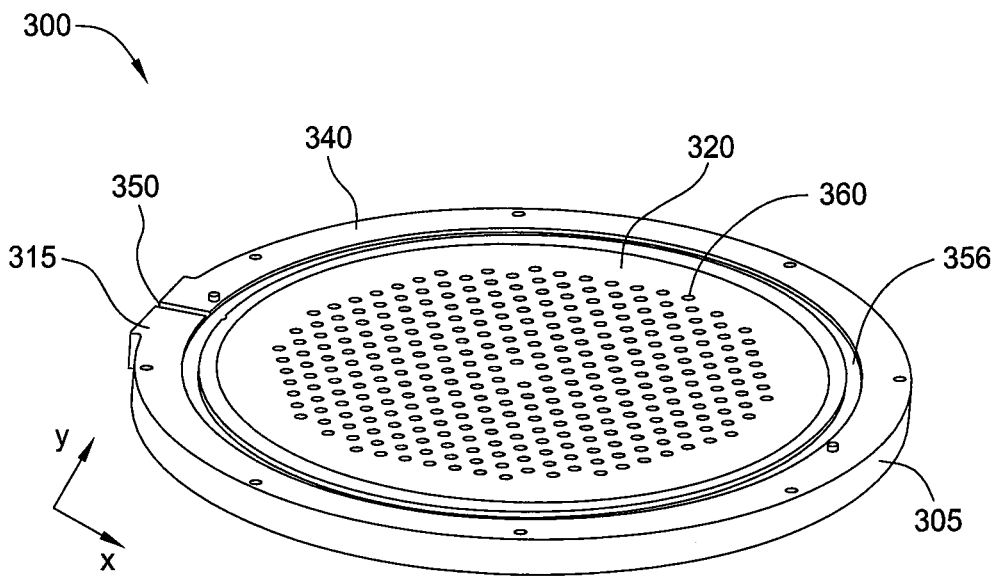
Figure 3B:
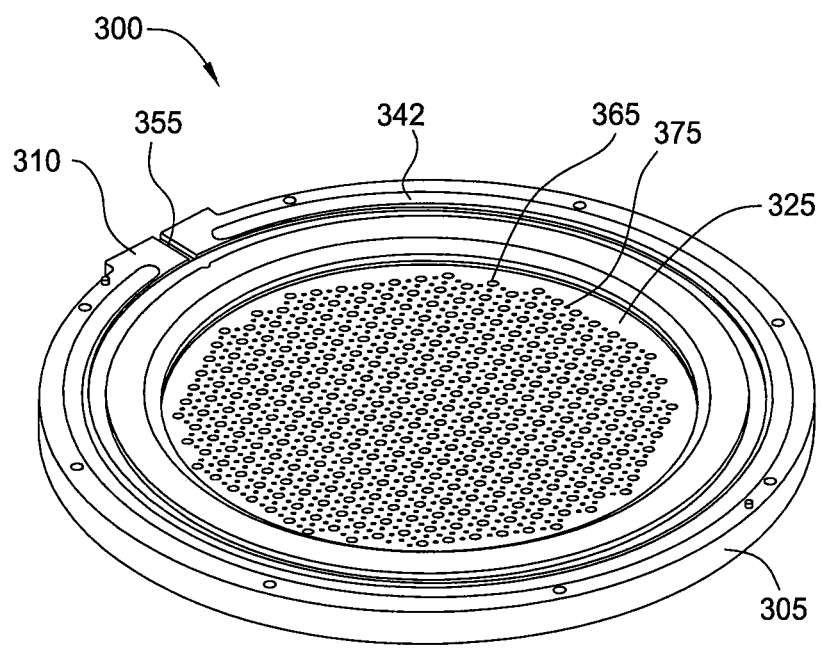
Figure 3C:
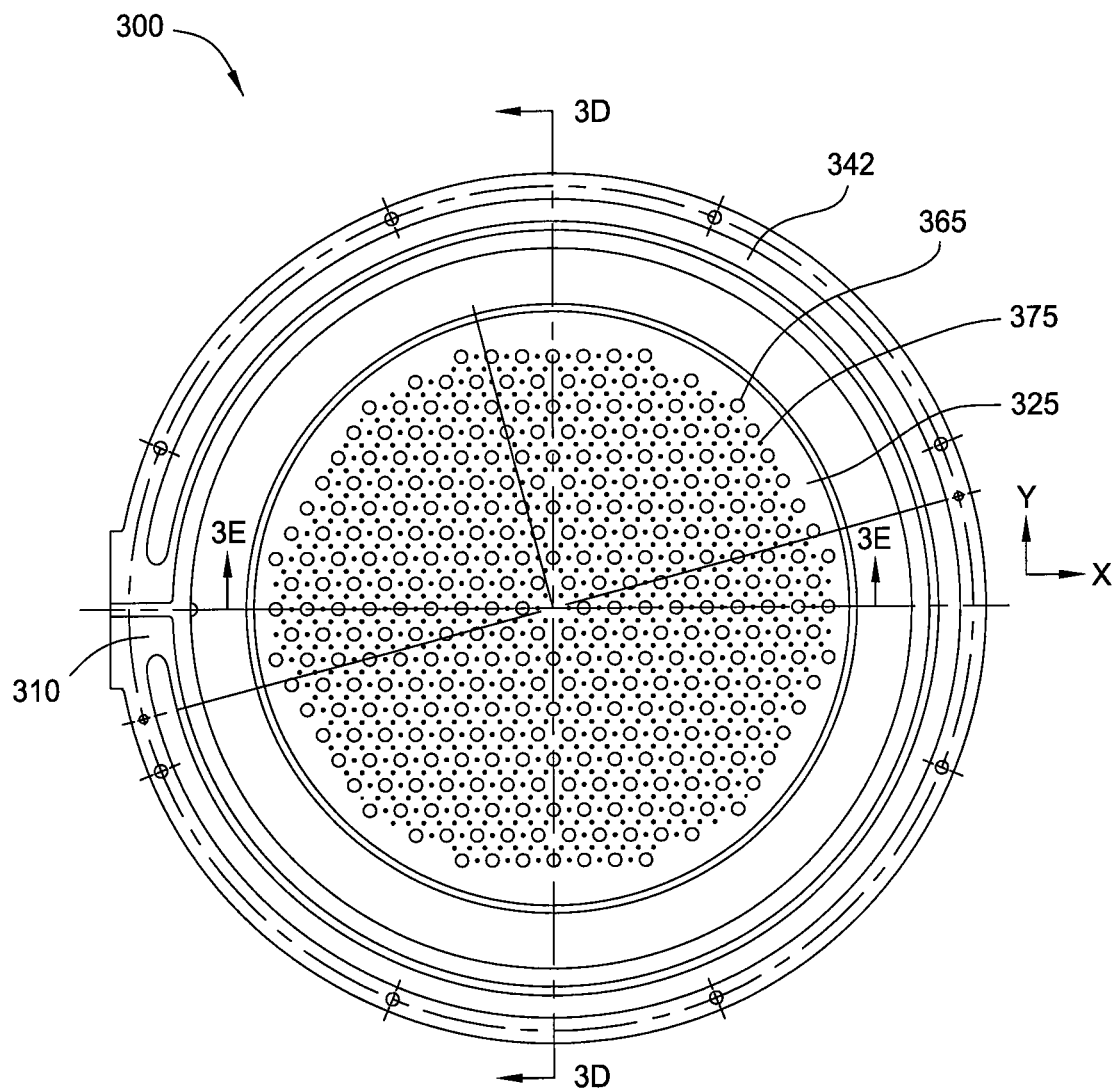
Figure 3D:
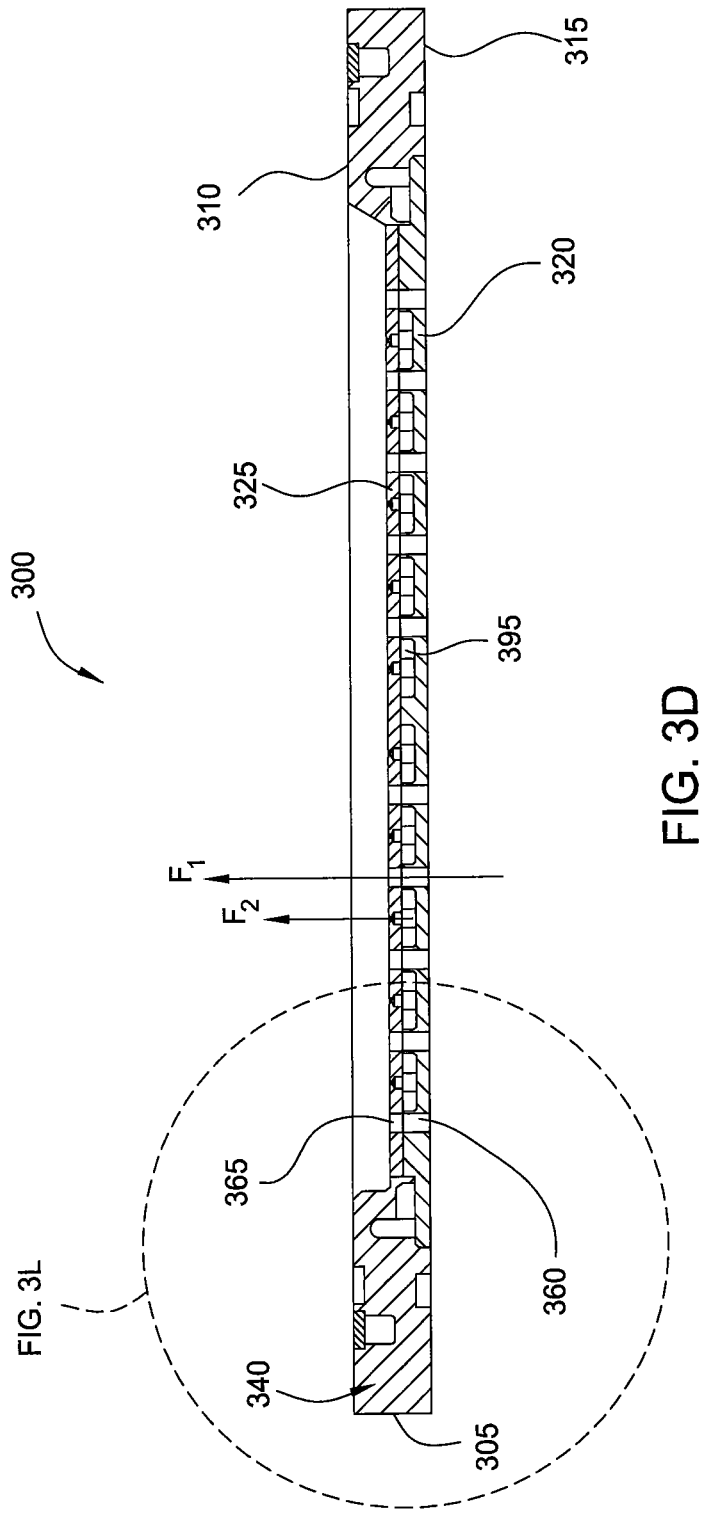
Figure 3J:
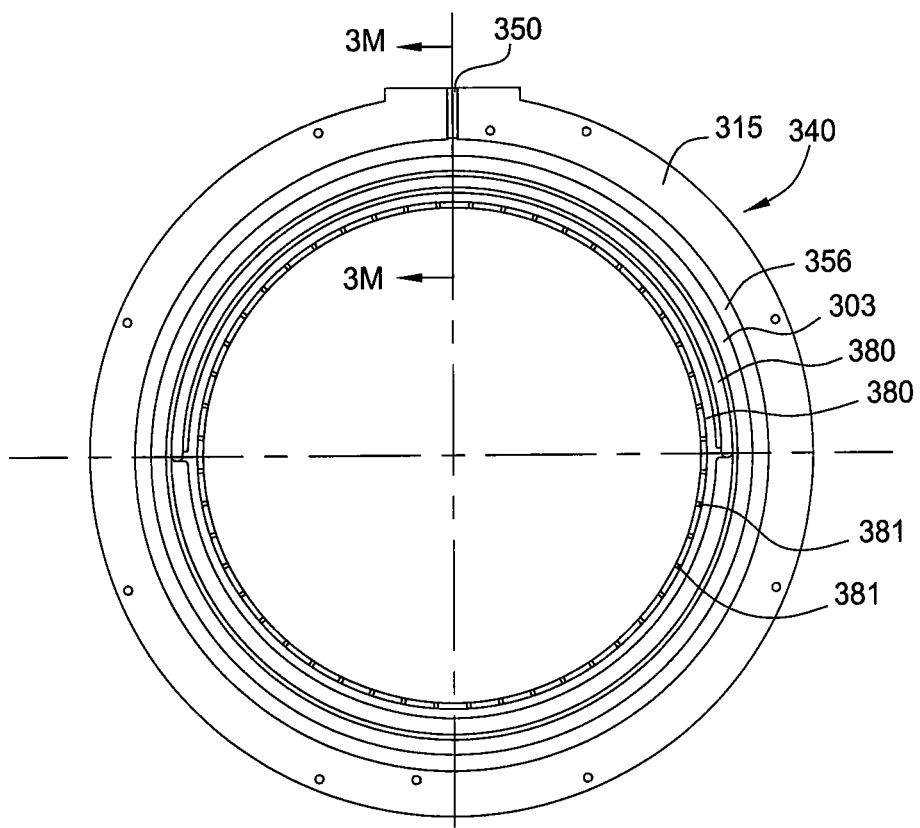
Figure 3K:
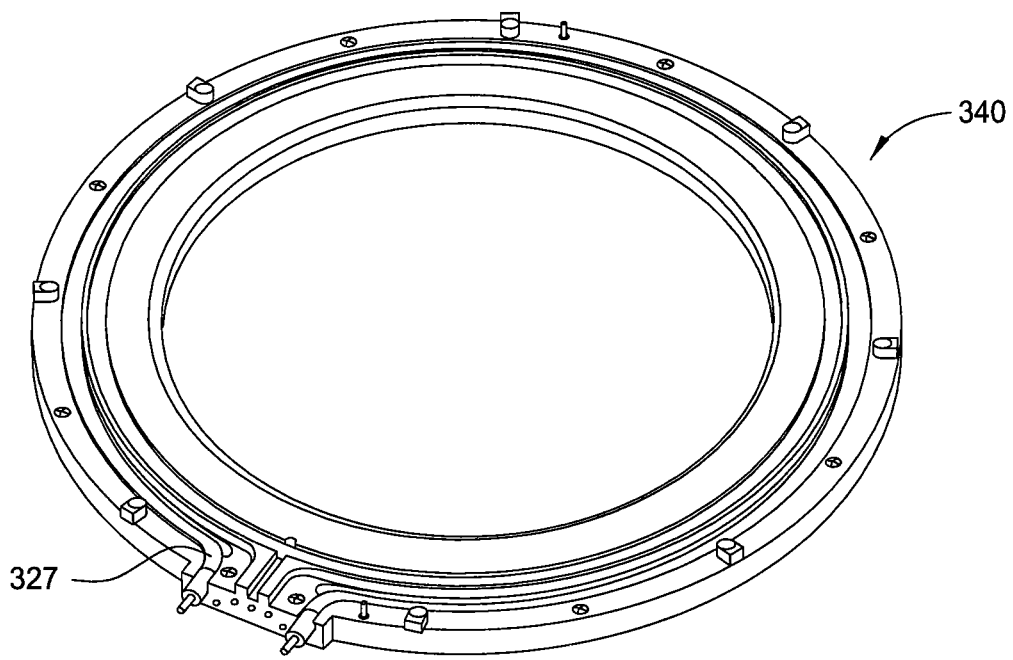
Figure 3L:
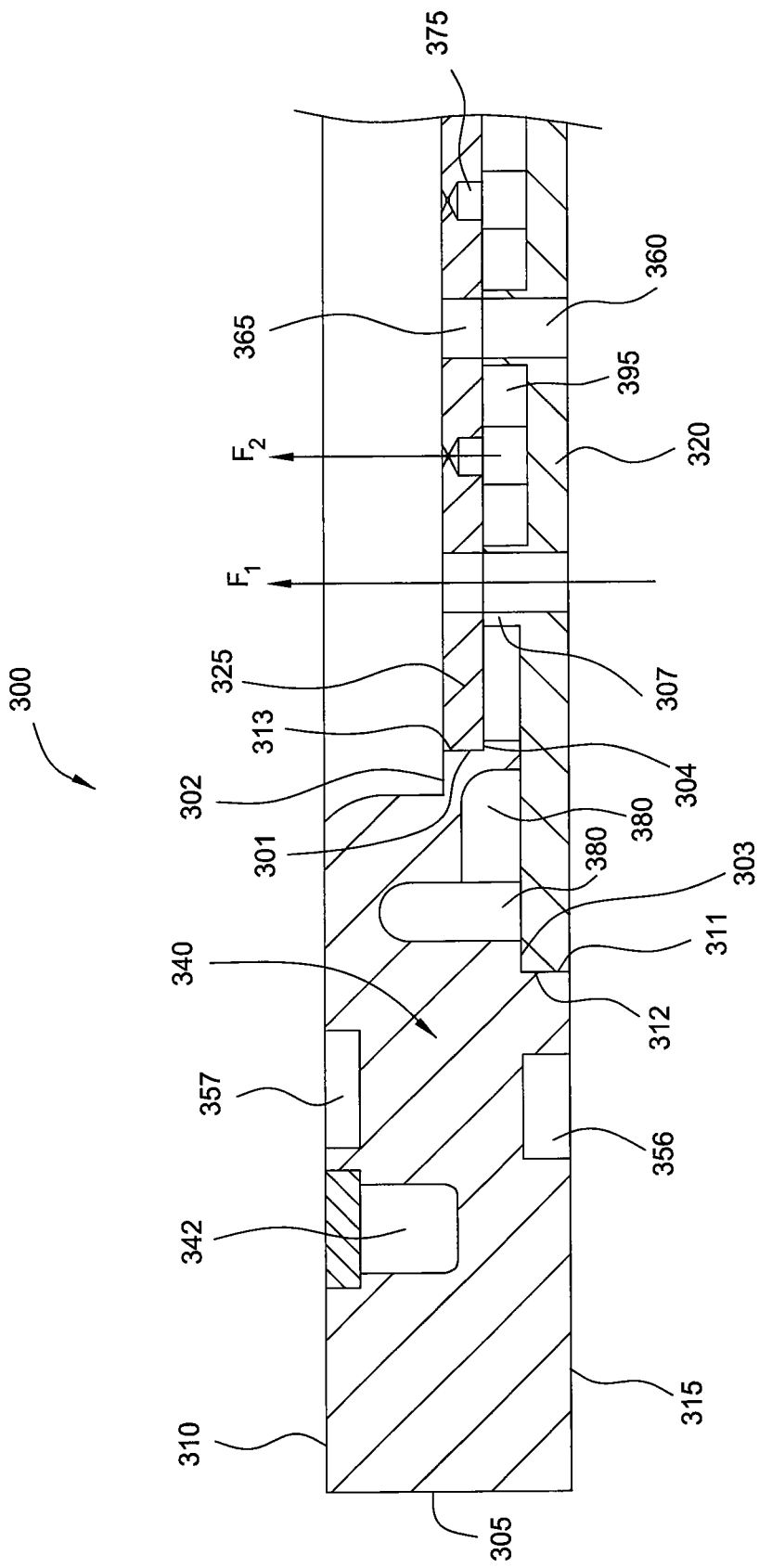
Figure 3M:
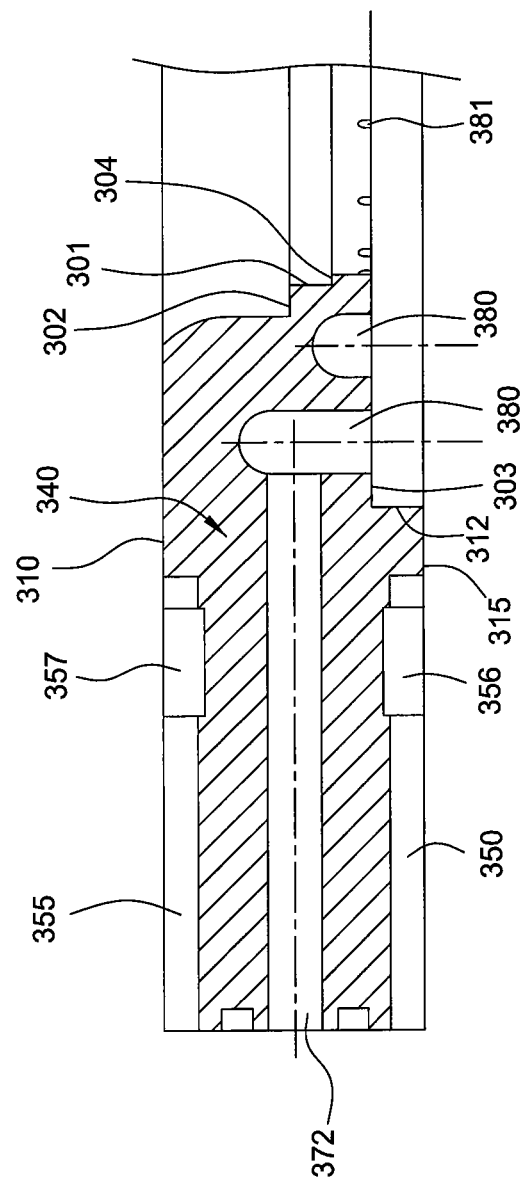

FIG. 3A illustrates an upper perspective view of a gas distribution assembly 300. In usage, the gas distribution system 300 will have a substantially horizontal orientation such that an axis of the gas apertures formed therethrough will be perpendicular or substantially perpendicular to the plane of the substrate support (see substrate support 265 in FIG. 2A. FIG. 3B illustrates a bottom perspective view of the gas distribution assembly 300. FIG. 3C is a bottom plan view of the gas distribution assembly 300. FIG. 3D is a cross sectional view of the gas distribution assembly 300 taken along line 3D-3D of FIG. 3C. FIG. 3E is a cross sectional view of a bottom plate 325 of the gas distribution assembly 300 taken along line 3E-3E of FIG. 3C. FIGS. 3F and 3G are magnified views of features of the bottom plate 325. FIG. 3H is a bottom plan view of an upper plate 320 of the gas distribution assembly 300. FIG. 3H' is a cross sectional view of the upper plate 320 taken along line 3H'-3H' of FIG. 3H. FIG. 3H" is a bottom perspective view of the upper plate 320. FIGS. 3I and 3I' are magnified views of features of the upper plate 320. FIG. 3J is a top view of an annular body 340 of the gas distribution assembly 300. FIG. 3K illustrates a perspective view of the bottom of the annular body 340 having a heating element 327 disposed therein. FIG. 3L is a magnified view of a portion of the gas distribution assembly 300 shown in FIG. 3D. FIG. 3M is a cross sectional view of the annular body 340 taken across line 3M-3M of FIG. 3J.

Referring to FIGS. 3A-M, the gas distribution assembly 300 generally includes the annular body 340, the upper plate 320, and the bottom plate 325. The annular body 340 is an annular ring which has an inner annular wall 301, an inner lip 302, which extends radially outward from the inner annular wall 301, an upper recess 303, a seat 304, and an outer wall 305, as seen especially in FIG. 3L. The annular body 340 has a top surface 315 and a bottom surface 310 which define the thickness of the annular body 340. A conduit 350 may be formed in the top surface 315 and fluidly coupled with a cooling channel 356, which may also be formed in the top surface 315, as shown in FIG. 3A. A conduit 355 may be formed in the bottom surface 310 and fluidly coupled with a cooling channel 357 which may also be formed in the bottom surface 310, as shown in FIG. 3B. The cooling channels 356,357 may be adapted to allow a cooling fluid to flow therethrough. A heater recess 342 may be formed in the bottom surface 310 and be adapted to hold a heating element 327, as shown in FIG. 3K.

The upper plate 320 is a disk-shaped body, having a diameter selected to mate with the diameter of the upper recess 303, with a number of first apertures 360 formed therethrough, as especially seen in FIGS. 3D and 3H-I'. The first apertures 360 may extend beyond a bottom surface 306 of the upper plate 320 thereby forming a number of raised cylindrical bodies 307. In between each raised cylindrical body 307 is a gap 395. As seen in FIGS. 3H and 3H", the first apertures 360 are arranged in a polygonal pattern on the upper plate 320, such that an imaginary line drawn through the centers of the outermost first apertures 360 define a 12 sided polygonal figure. The pattern may also feature an array of staggered rows from 5 to 60 rows, such as from 15 to 25 rows, example, 21 rows, of first apertures 360. Each row has, along the y-axis, from 5 to 20 first apertures 360, such as from 6 to 18 apertures, with each row being spaced between 0.4 and 0.7 inches apart, for example, about 0.54 inches apart. Each first aperture 360 in a row may be displaced along the x-axis from a prior aperture between 0.4 and 0.8 inches, such as about 0.63 inches, from each respective diameter. The first apertures 360 are staggered along the x-axis from an aperture in another row by between 0.2 and 0.4 inches, such as about 0.32 inches, from each respective diameter. The first apertures 360 may be equally spaced from one another in each row. There are a total of 312 first apertures 360 in the arrangement shown. It is contemplated that other hole patterns may be utilized.

At the center of the upper plate 360 there is a protrusion 308 instead of a first aperture 360, as shown in FIG. 3I'. The protrusion 308 extends to the same height as the raised cylindrical bodies 307.

The bottom plate 325 is a disk-shaped body having a number of second apertures 365 and third apertures 375 formed therethrough, as especially seen in FIGS. 3C and 3E-G. The bottom plate 325 has a uniform thickness, from about 0.1 to 0.2 inches, such as about 0.15 inches, and a diameter that mates with the diameter of the inner annular wall 301 of the annular body 340. The second apertures 365 are arranged in a pattern that aligns with the pattern of the first apertures 360 as described above. In one embodiment, when the upper plate 320 and bottom plate 325 are positioned one on top of the other, the axes of the first apertures 360 and second apertures 365 align. The plurality of first apertures 360 and the plurality of second apertures 365 may have their respective axes parallel or substantially parallel to each other, for example, the apertures 360,365 may be concentric. Alternatively, the plurality of first apertures 360 and the plurality of second apertures 365 may have the respective axis disposed at an angle from 1° to 30° from one another. At the center of the bottom plate 325 there is no second aperture 365, as shown in FIG. 3F.

The plurality of second apertures 365 and the plurality of third apertures 375 form alternating staggered rows. The third apertures 375 are arranged in between at least two of the second apertures 365 of the bottom plate 325. Between each second aperture 365 there is a third aperture 375, which is evenly spaced between the two second apertures 365. There are also six third apertures 375 positioned around the center of the bottom plate 325 in a hexagonal pattern. There is no third aperture 375 formed in the center of the bottom plate 325. There are also no third apertures 375 positioned between the perimeter second apertures 365 which form the verticies of the polygonal pattern of second apertures. There are a total of 876 third apertures 375 formed through the bottom plate 325.

The first, second, and third apertures 360,365,375 are all adapted to allow the passage of fluid therethrough. The first and second apertures 360,365 may have cylindrical shape and may, alternatively, have a varied cross-sectional shape including conical, cylindrical or a combination of multiple shapes. In one example, the first and second apertures 360,365 may have a diameter from about 0.125 inches to about 0.5 inches, such as about 0.25 inches. The second apertures 365 may alternatively have a diameter the same or greater than first apertures 360.

The third apertures 375 may have an hourglass shape, as seen in FIG. 3G. The third apertures may have a profile or define a shape of a first cylindrical section 376 (nozzle) having a first diameter from 0.2 and 0.3 inches, such as about 0.25 inches. The first cylindrical section 376 has an inlet at one end. The first cylindrical section 376 may have a height of about 0.1 to 0.12 inches, such as about 0.11 inches. A second cylindrical section 378 (throat) having a second diameter less than the first diameter is coupled to the first cylindrical section 376 by a transitional section 377. The second diameter may be from 0.01 to 0.03 inches, such as 0.016 inches, or about a ratio of first diameter to second diameter from 30:1 to 6:1, such as about 16:1. The second cylindrical section 378 may have a height of about 0.01 to 0.02 inches, such as about 0.017 inches. The transition section 377 tapers, such as at an angle of about 120°, from the first section 376 and first diameter to the second section 378 and second diameter. The transition section 377 may have a height of about 0.1 to 0.12 inches, such as about 0.11 inches. A third section 374 (diffuser) is coupled to the second cylindrical section 378. The third section 374 may have a conical shape expanding from the second cylindrical section 378 to an outlet with a height from 0.2 inches to 0.3 inches, such as 0.25 inches, and may have an outlet diameter greater then the second diameter and less than the first diameter. The third diameter may be from 0.05 inches to 0.08 inches, such as 0.06 inches. Alternatively, each of the plurality of third apertures may have a cylindrical shape and have a diameter the same or greater then the plurality of first apertures 360.

Referring to FIGS. 3J and 3M, the annular body 340 may have a number of fluid delivery channels 380 formed radially inward of the cooling channels 356,357 and into the upper recess 303. The fluid delivery channels 380 may be fluidly coupled to a conduit 372. The fluid delivery channels 380 may also be fluidly coupled with a plurality of fluid passages 381 which are formed into the upper recess 303 radially inward of the fluid delivery channels 380.

As stated previously, the gas distribution assembly 300 generally consists of the annular body 340, the upper plate 320, and the bottom plate 325. The upper plate 320 is positioned within the upper recess 303 with the raised cylindrical bodies 307 facing toward the bottom surface 310 of the annular body 340, as shown in FIG. 3L. The bottom plate 325 is then positioned on the seat 304 with and rotatably oriented so that the axes of the first and second apertures 360,365 are aligned, as shown in FIG. 3L. The upper plate 320 is sealingly coupled to the bottom plate 325 to fluidly isolate the first and second apertures 360,365 from the third apertures 375. For example, the upper plate 320 may be brazed to the bottom plate 325 such that a seal is created between a surface of the raised cylindrical bodies 307 and a surface of the bottom plate 325. The upper plate 320 and bottom plate 325 are then E-beam welded to the annular body 340. The upper plate 320 is E-beam welded such that a seal is created between an outer edge 311 of the circular body and an inner edge 312 of the upper recess 303. The bottom plate 325 is E-beam welded such that a seal is created between an outer edge 313 of the circular body and the inner annular wall 301. Fluid may flow through the first and second apertures 360,365 along flow path $F_1$. Fluid may also flow separately through the conduit 372, into the fluid delivery channels 380, through the fluid passages 381, through the gaps 395, and through the third apertures 375 along flow path $F_2$. Having fluid flow along two separate flow paths $F_1,F_2$ ensures that reaction of the fluids occurs after exiting the gas distribution assembly 300 which may help to prevent build up of materials within the gas distribution assembly 300. In one embodiment, the surfaces of the gas distribution assembly 300 may be electro-polished.

Figure 4A:
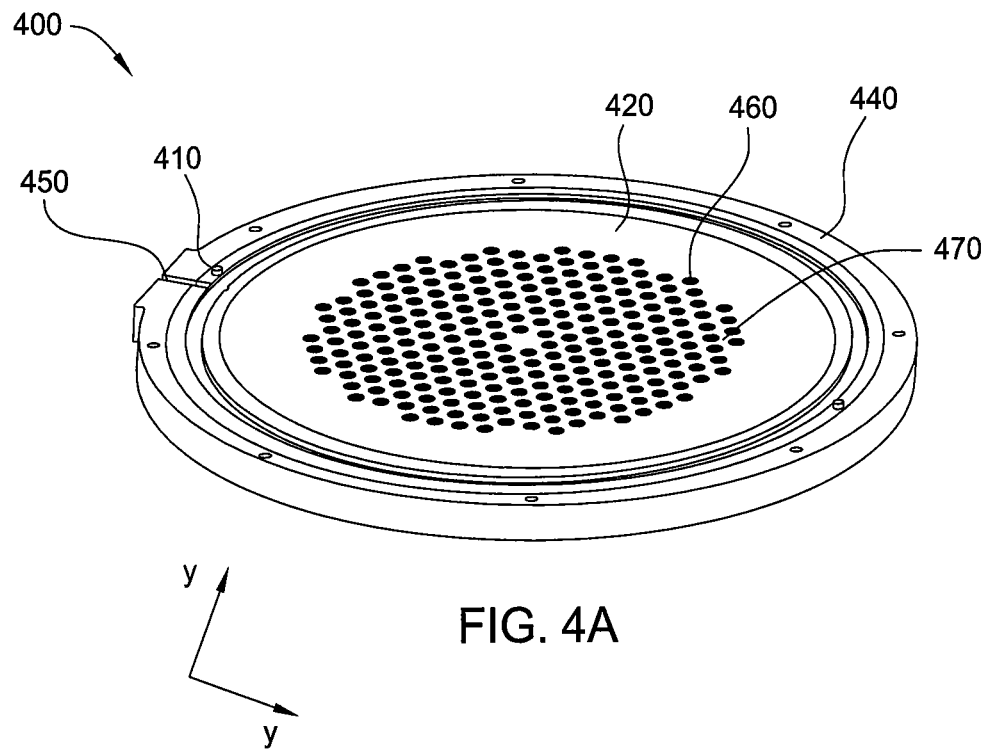
Figure 4B:
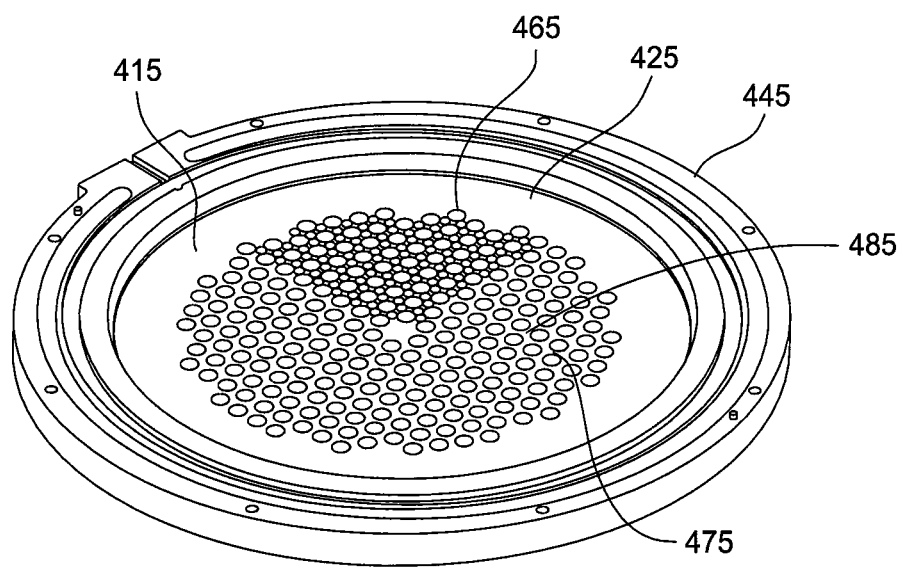
Figures 4C, 4D:
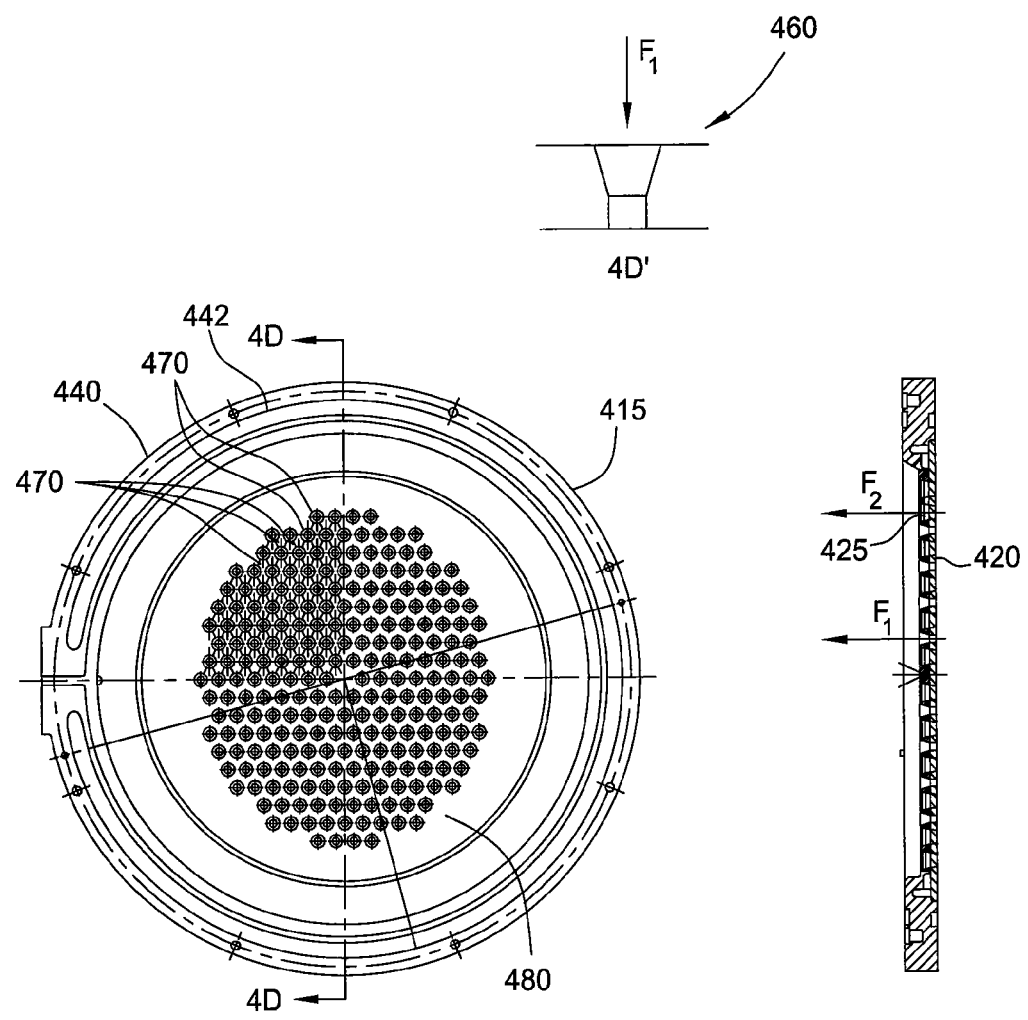
Figure 4H:
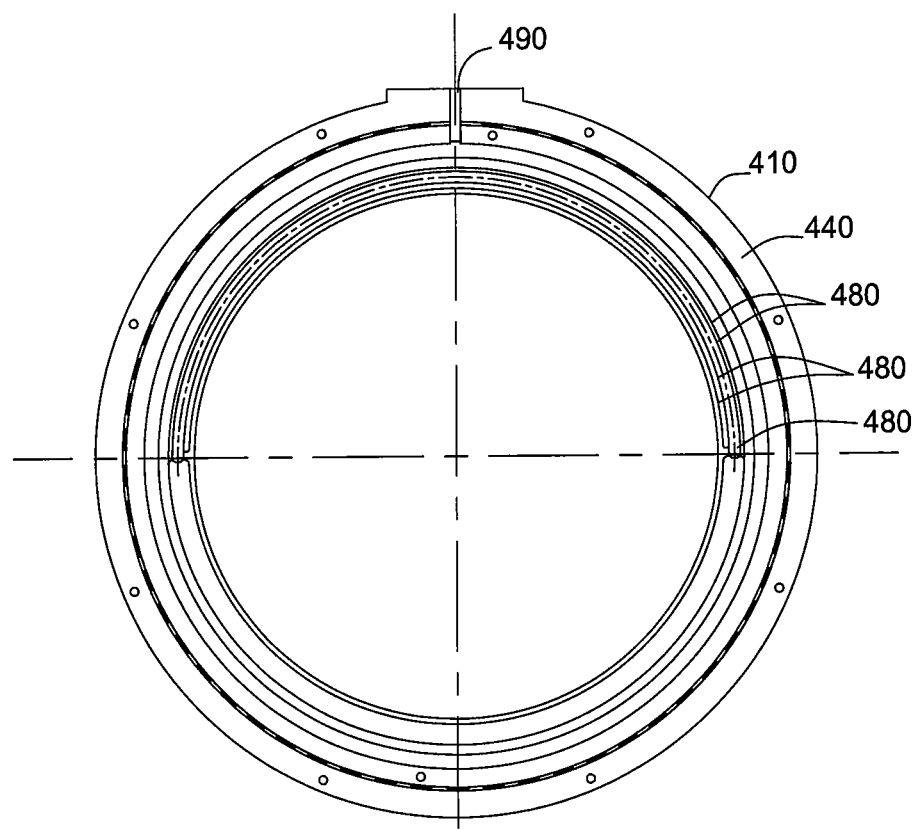
Figure 4I:
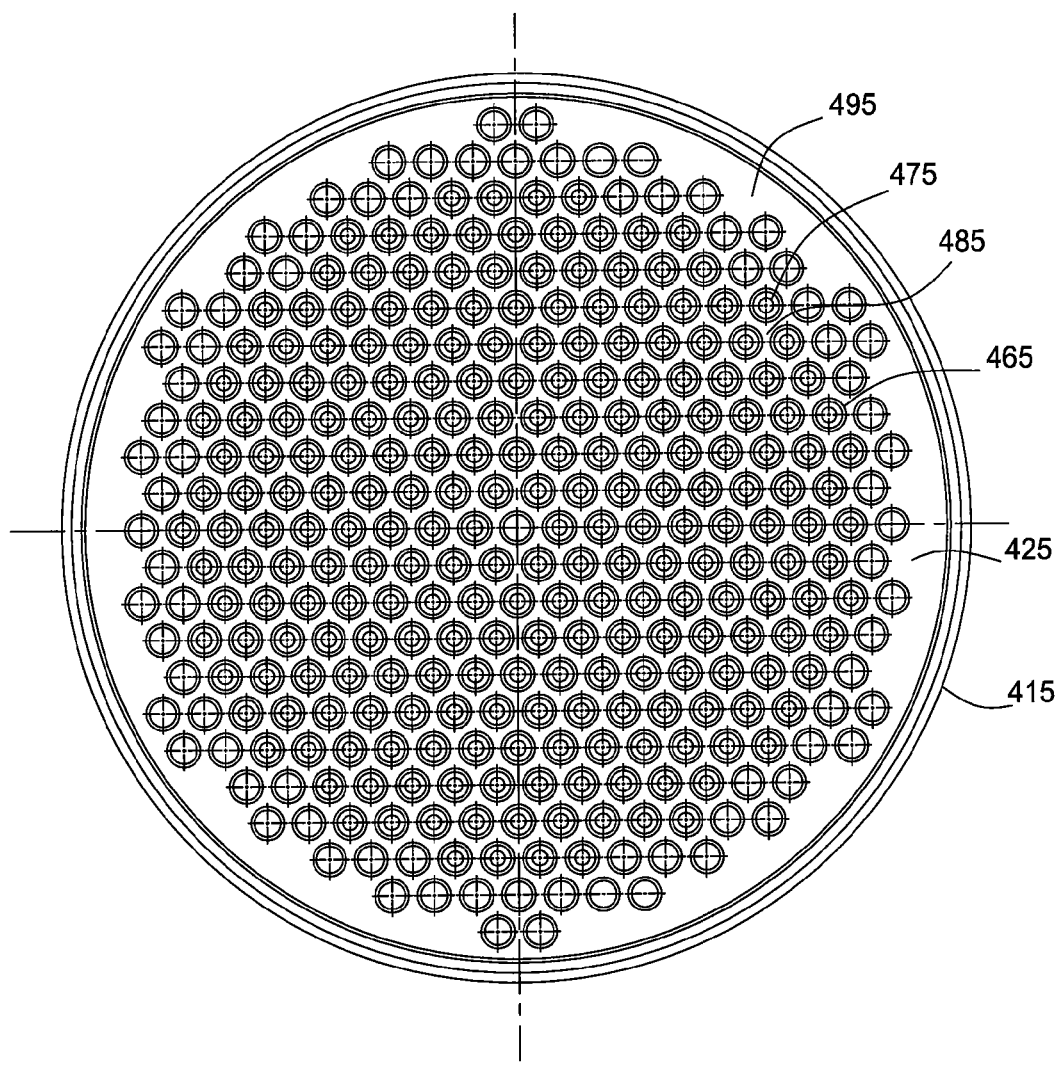

Referring to FIGS. 4A-4H, one embodiment of a gas distribution assembly 400, or showerhead, is provided including a first or upper manifold 410 and a second or bottom manifold 415, and the top of the second manifold 415 is adapted to be coupled to the bottom of the first manifold 410. In usage, the orientation of the showerhead 400 to the substrate will be done in such a way that the axis of any apertures formed in the showerhead will be perpendicular or substantially perpendicular to the substrate plane FIG. 4A illustrates a perspective view of the top of the showerhead including the first manifold 410 and FIG. 4B illustrates a perspective view of the bottom of the showerhead including the second manifold 415. FIG. 4C illustrates a bottom plan view of the second manifold. FIG. 4D illustrates a side view of the showerhead along line 4D of FIG. 4C. FIG. 4D' is a schematic side view of one embodiment of the first aperture. FIG. 4E is a schematic side view of the circular plate of the second manifold. FIG. 4F is a schematic side view of one embodiment of the third aperture of FIG. 4E. FIG. 4G is a schematic side view of one embodiment of the second and third apertures of FIG. 4E. FIG. 4H is a top view of the first manifold and does not show the circular plate with the apertures. FIG. 4I is a top view of the bottom manifold having the circular plate with aperture pattern described herein and does not show the circular plate.

First manifold 410 includes an inner circular plate 420 disposed in an outer rim 440. A lateral conduit 450 formed in the outer rim 440.

Referring to FIGS. 4A and 4B, the inner circular plate 420 has a plurality of first apertures 460 formed in a pattern portion 470 and the apertures are adapted for passage of a fluid therethrough. The pattern portion 470 may comprise an array of staggered rows from 15 to 25 rows, for example, 19 rows. Each row has, along the y-axis, from 2 to 20 apertures, such as from 4 to 17 apertures, with each row being spaced between 0.4 and 0.7 inches apart, for example, about 0.54 inches apart. Each aperture in a row may be displaced along the x-axis from a prior aperture between 0.4 and 0.8 inches, such as about 0.63 inches, from each respective diameter. The apertures are staggered along the x-axis from an aperture in another row by between 0.2 and 0.4 inches, such as about 0.31 inches, from each respective diameter. The apertures may be equally spaced from one another in each row.

Each first aperture 460 may have a conical inlet portion tapering to a first cylindrical portion. In one example, the apertures 460 may have an inlet diameter from about 0.2 inches to about 0.5 inches, such as about 0.35 inches tapering at about 90° to a first cylindrical portion diameter from 0.125 to 0.4 inches, for example, about 0.25 inches. The apertures 460 extend through the circular plate to provide a passage for fluids therethrough. The combined height of the first aperture is from 0.05 to 0.15 inched and the conical inlet portion tapering to a first cylindrical portion may have equal heights. The patterned portion of the circular plate may vary based on the size of the circular plate, and can be at a diameter from about 0.5 to about 6 inches of the circular plate having a diameter of about 14 inches.

Referring to FIGS. 4B, 4E, 4F, 4G, 4H and 4I, the inner circular plate 425 has a plurality of second apertures 465 formed in a pattern portion 485 and the second apertures are adapted for passage of a fluid therethrough. The inner circular plate also has a plurality of third apertures 475 formed in the pattern portion 485 and the second apertures are adapted to pass a gas introduced into the showerhead by a fluid passage into a processing chamber in which the showerhead is positioned. The circular plate has a thickness from about 0.1 to 0.2 inches, such as about 0.15 inches.

Referring to FIG. 4H, the first manifold 415 is encircled by a plurality of fluid delivery channels 480 formed in the rim 440 which are in fluid communication with the third apertures 475 and are in fluid communication with a second fluid source entry 490 adapted to allow passage of a fluid from an external source into the showerhead. The second manifold 415 includes an inner circular plate 425 disposed within an outer rim 445.

The plurality of second apertures 465 of the second manifold may be aligned with the plurality of first apertures. The plurality of first apertures 460 and the plurality of second apertures 465 may have the respective axis parallel or substantially parallel to each other. Alternatively, the plurality of first apertures 460 and the plurality of second apertures 465 may have the respective axis disposed at a angle from 1° to 30° from one another.

The pattern portion 485 may comprise an array of staggered rows from 15 to 25 rows, for example, 19 rows. Each row has, along the y-axis, from 2 to 20 apertures, such as from 4 to 17 apertures, with each row being spaced between 0.4 and 0.7 inches apart, for example, about 0.54 inches apart. Each aperture in a row may be displaced along the x-axis from a prior aperture between 0.4 and 0.8 inches, such as about 0.63 inches, from each respective diameter. The apertures are staggered along the x-axis from an aperture in another row by between 0.2 and 0.4 inches, such as about 0.31 inches, from each respective diameter. The apertures may be equally spaced from one another in each row.

Each second aperture 465 may have a second cylindrical portion coupled to a conical outlet portion expanding to an outset. In one example, the apertures 465 may have a second cylindrical portion diameter from 0.125 to 0.4 inches, for example, about 0.25 inches and an outlet diameter from about 0.2 inches to about 0.5 inches, such as about 0.40 inches tapering at about 40° from the second cylindrical portion. The apertures 465 may have a diameter the same or grater than apertures 460. The apertures 465 extend through the circular plate to provide a passage for fluids therethrough. The combined height of the first aperture is from 0.05 to 0.5 inches, for example, about 0.35 inches. The patterned portion of the circular plate may vary based on the size of the circular plate, and can be at a diameter from about 0.5 to about 6 inches of the circular plate having a diameter of about 14 inches.

The pattern portion 485 may comprise the plurality of third apertures in an array of staggered rows from 30 to 45 rows, for example, 37 rows. Each row has, along the y-axis, from 2 to 30 third apertures, such as from 3 to 17 apertures, with each row being spaced between 0.2 and 0.35 inches apart, for example, about 0.31 inches apart. Every other row may be disposed along the same x-axis row as the second apertures, and the third apertures may be in an alternating order with the second apertures along the x-axis. Each third aperture in a row may be displaced along the x-axis from a prior third aperture between 0.4 and 0.8 inches, such as about 0.31 inches, from each respective diameter for a row with only third apertures. Each third aperture in a row may be displaced along the x-axis from a prior second aperture between 0.4 and 0.8 inches, such as about 0.31 inches, from each respective diameter for a row with only third apertures. The third apertures are staggered along the x-axis from a third aperture in another row by between 0.1 and 0.2 inches, such as about 0.16 inches, from each respective diameter. The apertures may be equally spaced from one another in each row.

Referring to FIG. 4G, the third apertures may have a profile or define a shape of a first cylindrical portion 476 (nozzle) having a first diameter from 0.2 and 0.3 inches, such as about 0.25 inches. The first cylindrical portion has an inlet at one end. The first cylindrical portion may have a height of about 0.1 to 0.16 inches, such as about 0.14 inches. A second cylindrical portion 478 having a second diameter less than the first diameter is coupled to the first cylindrical portion 476 by a transitional section 477. The second diameter may be from 0.04 to 0.07 inches, such as 0.06 inches, or about a ratio of first diameter to second diameter from 7.5:1 to 3:1, such as about 4:1. The second cylindrical portion may have a height of about 0.01 to 0.1 inches, such as about 0.05 inches. The transition portion 477 tapers, such as at an angle of about 40°, from the first section and first diameter to the second section and first prime diameter of from grater than 0.07 to 0.1, for example, about 0.08 inches. The first prime diameter is greater than the second diameter.

A third cylindrical portion 444 (throat) is coupled to the second cylindrical portion 478 and may have a third diameter from 0.01 to 0.03 inches, such as 0.016 inches, or about a ratio of first diameter to third diameter from 30:1 to 6:1, such as about 16:1. The third cylindrical portion may have a height of about 0.01 to 0.03 inches, such as about 0.025 inches. A fourth cylindrical portion 479 (diffuser) is coupled to the third cylindrical portion 444. The fourth cylindrical portion may have a diameter similar to the second cylindrical portion 478 having a fourth diameter less than the first diameter. The fourth diameter may be from 0.04 to 0.07 inches, such as 0.06 inches, or about a ratio of first diameter to second diameter from 7.5:1 to 3:1, such as about 4:1. The fourth cylindrical portion may have a height of about 0.01 to 0.5 inches, such as about 0.025 inches.

Referring to FIGS. 4E-4H, a first fluid flows, F1, such as a processing gas, through the showerhead via a first aperture 460 in the upper manifold and the second aperture 465 in the bottom manifold before entry into a processing region. The second fluid flows, F2, such as a precursor, to the processing region by flowing through an channel 490 to a gas distribution channel 480 to an inner region 495 between the upper manifold and the lower manifold that is an isolated flow path surrounding the first and second apertures and exits through third apertures 475. Both the first fluid and the second fluid are isolated from one another in the showerhead until delivery into a processing region.

Referring to FIGS. 5A-5F, one embodiment of a gas distribution assembly 500, or showerhead, is provided including a first, or upper, manifold 510, a second, or center, manifold 520 coupled to the bottom of the first manifold 510, and a third, or bottom, manifold 530 coupled to the bottom of the second manifold 520. In usage, the orientation of the showerhead 500 to the substrate will be done in such a way that the axis of any apertures formed in the showerhead will be perpendicular or substantially perpendicular to the substrate plane.

Figure 5A:
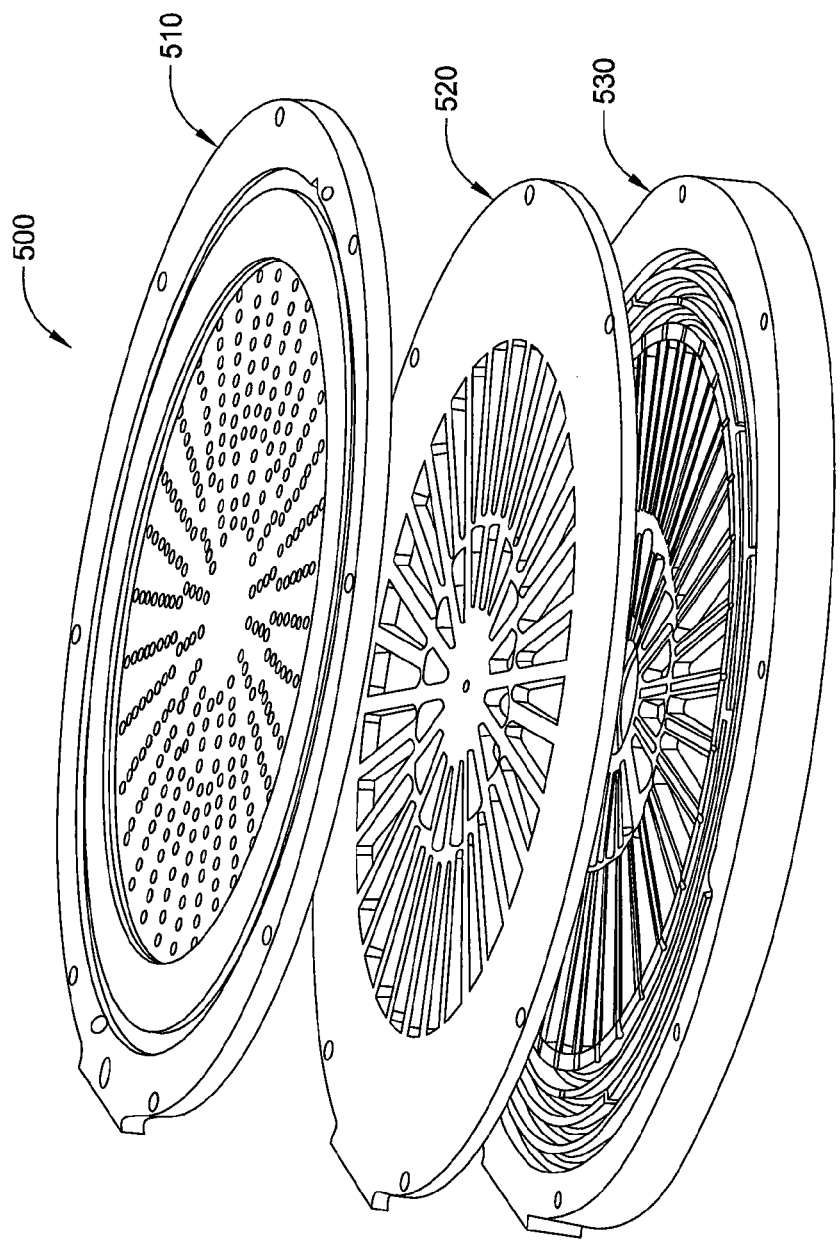
FIG. 5A-5F are schematic views of one embodiment of a gas distribution assembly as described herein.

FIG. 5A illustrates a perspective view of the first manifold 510, the second manifold 515, and the third manifold 520. FIG. 5B illustrates a top plan view of the top manifold. FIG.

5C illustrates a top plan view of the center manifold. FIG. 5D illustrates a perspective view of the top of the bottom manifold. FIG. 5E illustrates a cutout perspective view of the first manifold 510, the second manifold 515, and the third manifold 520. FIG. 5F illustrates an enlarged portion of the cutout perspective view of FIG. 5E.

Referring to FIGS. 5A and 5B, the upper manifold 510 may have a patterned portion 516 having a plurality of first apertures 511 formed in a plurality of first radial rows 512 concentrically disposed around a center portion 513 of the upper manifold, and a plurality of second apertures 514 concentrically disposed around the plurality of first apertures 511 and the plurality of second apertures 514 are formed in a plurality of second radial rows 515.

The plurality of first apertures 511 may comprise a plurality of first radial rows 512, such as from 2 to 24 rows, for example, 16 rows, of two or more apertures, such as from 2 to 10 apertures, for example, about 4 apertures, in each radial row. The concentric radial rows may be equally spaced from one another at equal angles. The apertures may be equally spaced from one another in each radial row. Each aperture may have cylindrical shape in the circular plate. In one example, the apertures 511 may have a diameter from about 0.1 inches to about 0.5 inches, such as about 0.2 inches, and extend through the circular plate to provide a passage for fluids therethrough.

The plurality of second apertures 514 concentrically disposed around the plurality of first apertures 511 may comprise a plurality of second radial rows 515, such as from 3 to 40 rows, for example, 32 rows, of two or more apertures, such as from 2 to 10 apertures, for example, about 5 apertures, in each radial row. The radial rows may be equally spaced from one another at equal angles. The second apertures may be equally spaced from one another in each radial row. Each second aperture may have cylindrical shape in the circular plate. In one example, the apertures 514 may have a diameter from about 0.1 inches to about 0.5 inches, such as about 0.2 inches, and extend through the circular plate to provide a passage for fluids therethrough.

Shown as a broken line in FIG. 5B, a backside channel 518 may be formed in the backside of the upper manifold 510 for delivery of gas to a center gap 519 (also shown in broken lines). The backside channel supplies a second fluid to the center gap from an external source, which second fluid is transferred through a center aperture of the center manifold into the center of the bottom manifold, where a inner plurality of gas channels are fluidly in communication with the center of the bottom manifold and in fluid communication with a processing region via apertures disposed in the gas channels.

Figure 5C:
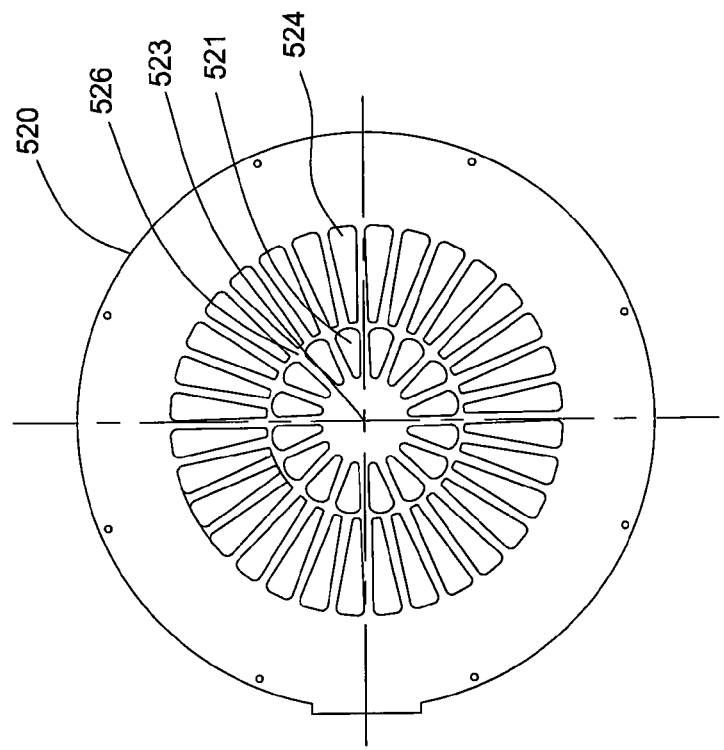
Figure 5B:
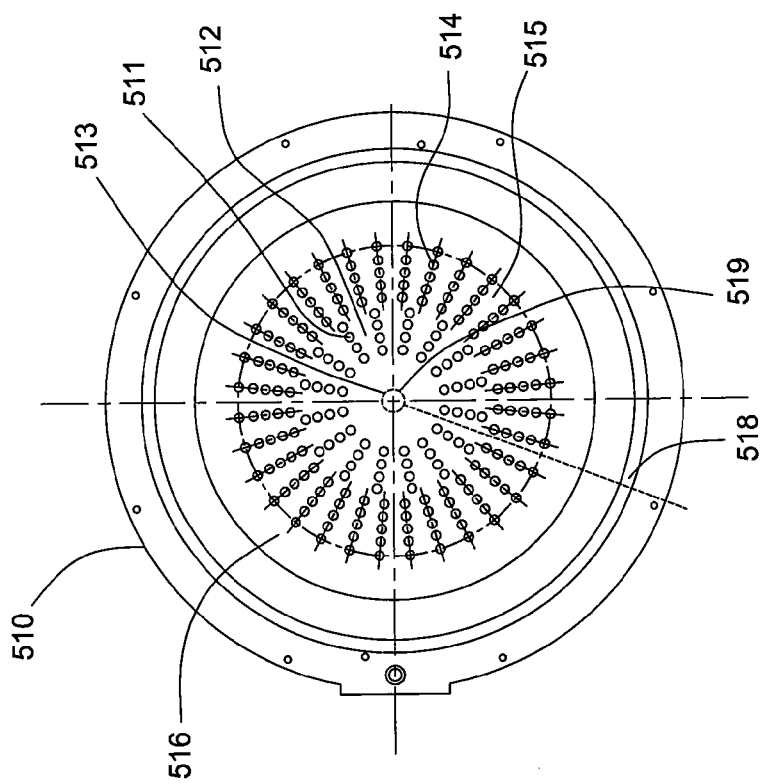
Figure 5D:
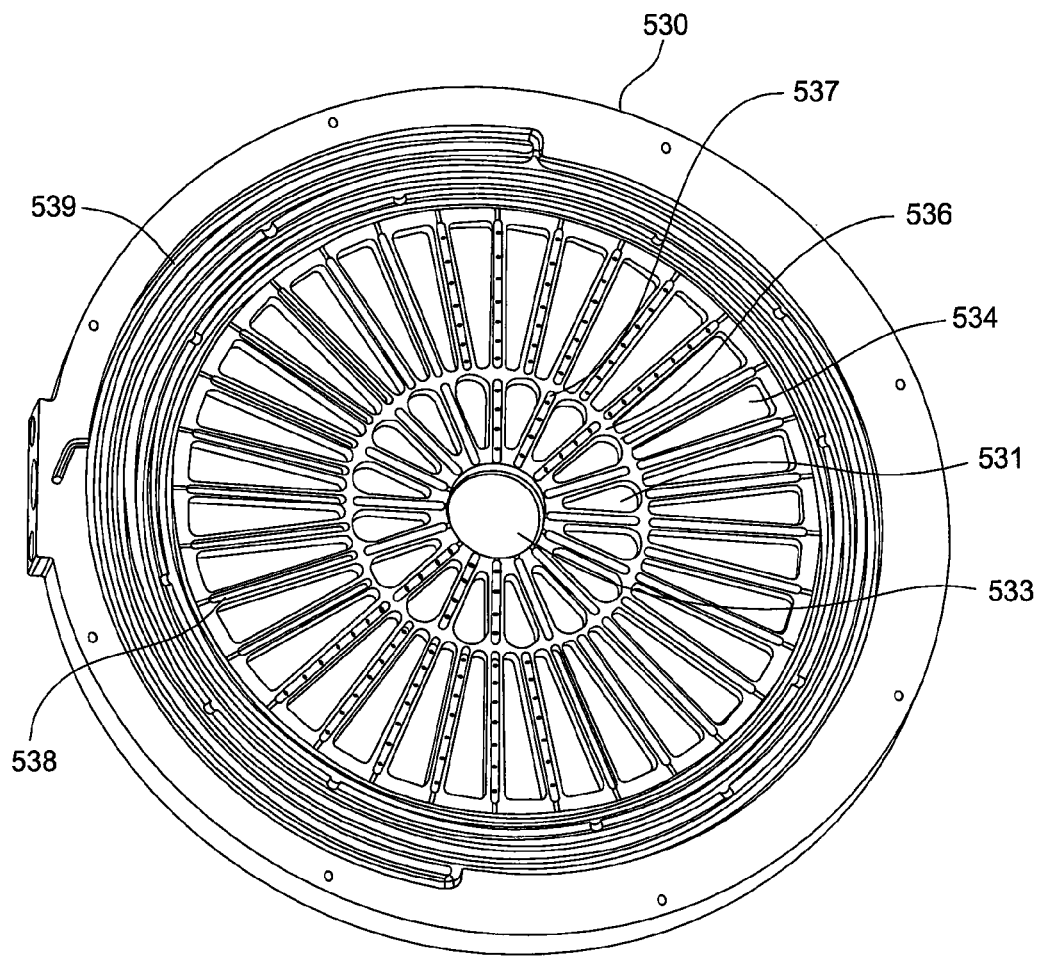
Figure 5E:
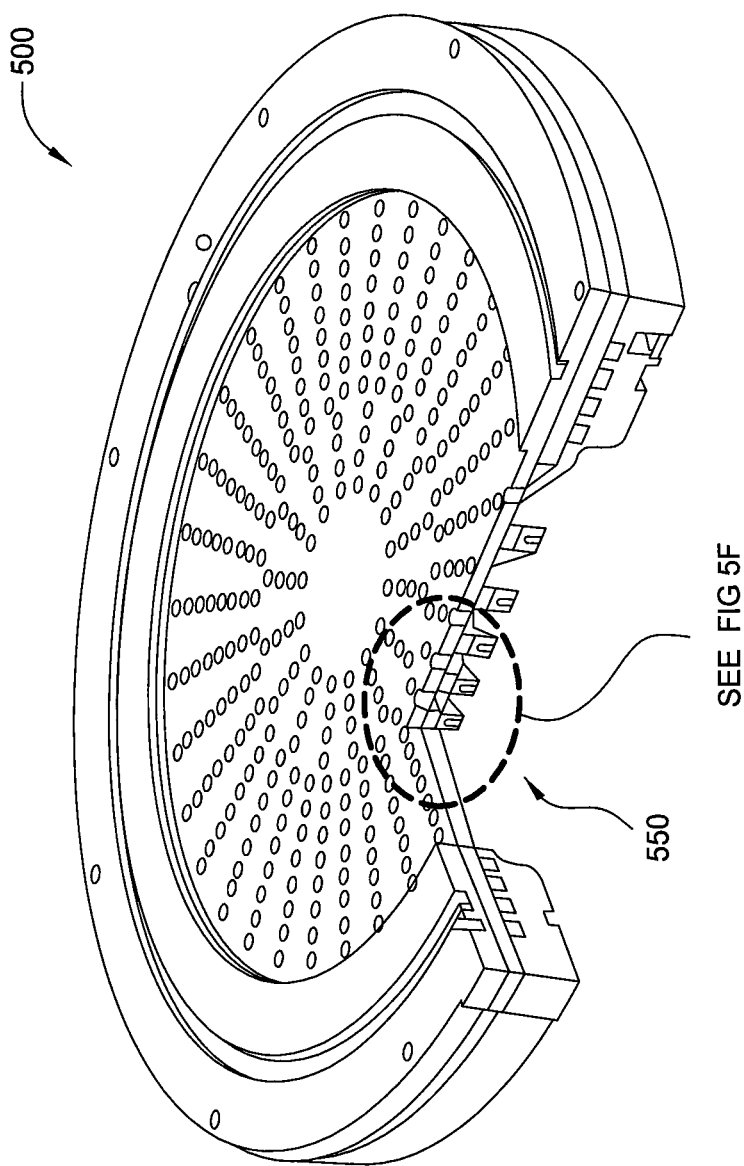
Figure 5F:
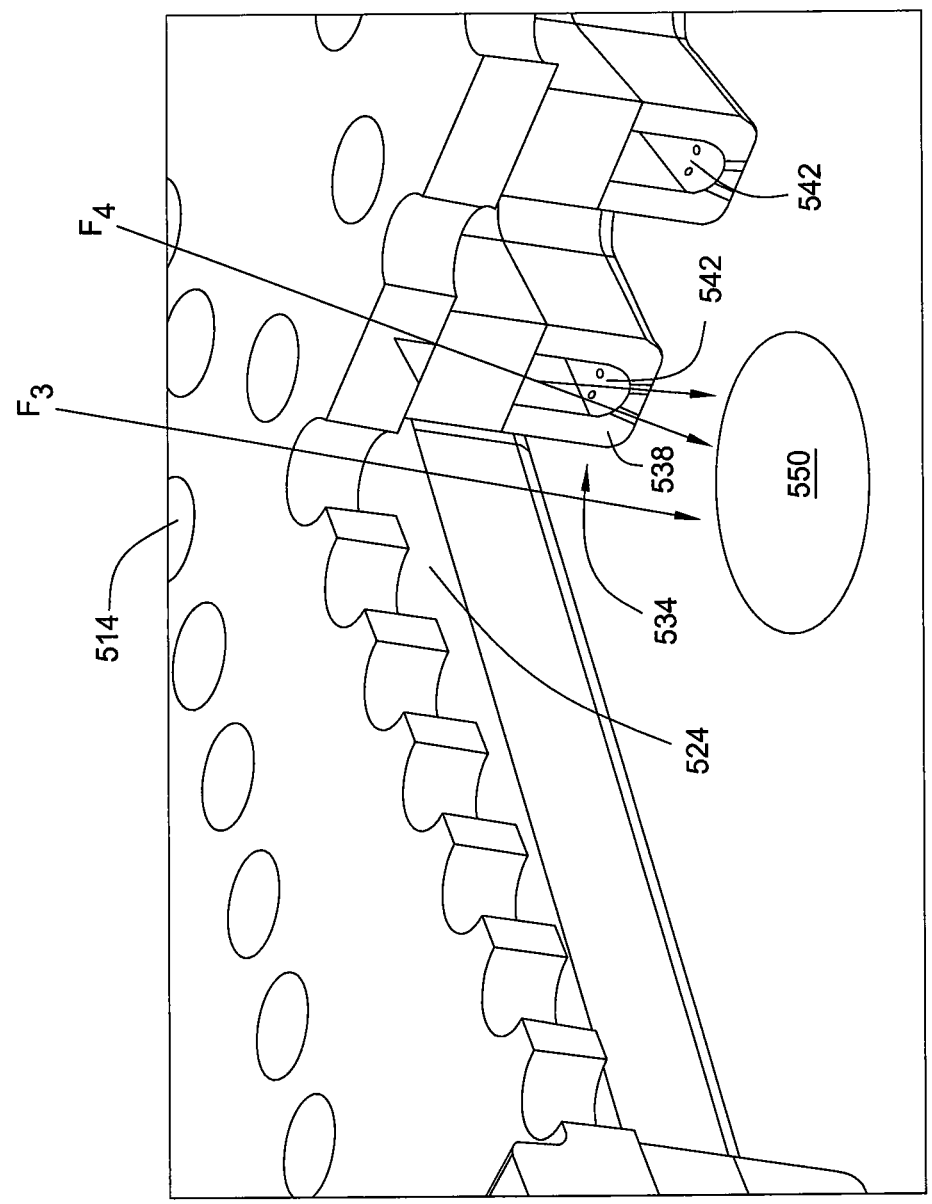

Referring to FIGS. 5A and 5C, the center manifold 520 may have a patterned portion 526 having a plurality of first openings 521 formed in a concentric circular row disposed around a center portion 523 of the center manifold and a plurality of second openings 524 formed in a concentric circular row that is concentrically disposed around the plurality of first openings 521.

The first openings 521 may be formed in a triangular or pear shape. The shape may comprise an initial side disposed adjacent the center of the manifold and expanding to a perimeter portion at an angle from 5° to 45°, for example, 22.5°. The perimeter portion may be rounded or flat in shape. The first openings 521 may comprise from 2 to 24 openings, for example, 16. Each of the first openings 521 may be position to correspond to one of the first radial rows 512. Each opening 521 may be adapted to have sufficient size to provide an opening encompassing all of the apertures for each respective first radial row. The first openings 521 may be equally spaced from one another at equal angles.

The second openings 524 may be formed in a triangular or pear shape. The shape may comprise an initial side disposed adjacent the plurality of first openings 521 and expanding to a perimeter portion at an angle from 5° to 45°, for example, 11.25°. In one embodiment of the second opening, the second opening has about one-half the expansion angle of the first openings. The perimeter portion may be rounded or flat in shape. The second openings 524 may comprise from 4 to 48 openings, for example, 32 openings. Each of the second openings 524 may be position to correspond to one of the second radial rows 515. Each second opening 524 may be adapted to have sufficient size to provide an opening encompassing all of the apertures for each respective second radial row. The second openings 524 may be equally spaced from one another at equal angles. The second opening may be provided at a ratio of first openings to second openings of 1:1 to 1:3, for example 1:2. In one example, the center manifold comprises 16 first openings expanding at an angle of 22.5° and 32 second openings at an angle of 11.25°.

The center portion 523 of the center manifold may comprise an aperture to allow fluid communication of a fluid from the back center of the upper manifold to the center 533 of the bottom manifold.

Referring to FIGS. 5A and 5D, the bottom manifold 530 may have a patterned portion 536 having a plurality of first openings 531 formed in a concentric circular row disposed around a center portion 533 of the center manifold, a plurality of first gas channels 537 disposed between the plurality of first openings 531, a plurality of second openings 534 formed in a concentric circular row that is concentrically disposed around the plurality of first openings 531, a plurality of second gas channels 538 disposed between the plurality of second openings 534, and a channel network 539 disposed concentrically around the a plurality of second gas channels 538 and the plurality of second openings 534.

The gas channel network 539 is fluidly coupled to the plurality of second gas channels 538 and may be fluidly isolated from the second openings 531. The plurality of first gas channels 537 may be fluidly coupled to the center portion 533 and may be fluidly isolated from the first openings 531. The first fluid channels 537 may be fluidly isolated from the second fluid channels 538. The first fluid channel includes apertures 542 for delivery of the fluid to the processing region.

The first openings 531 may be formed in a triangular or pear shape. The shape may comprise an initial side disposed adjacent the center of the manifold and expanding to a perimeter portion at an angle from 5° to 45°, for example, 22.5°. The perimeter portion may be rounded or flat in shape. The first openings 531 may comprise from 2 to 24 openings, for example, 16. Each of the first openings 531 may be position to correspond to one of the first openings 521 of the center manifold. Each opening 531 may also be adapted to have sufficient size to provide an opening encompassing all of the apertures for each respective first radial row of the upper manifold. The first openings 531 may be equally spaced from one another at equal angles.

The second openings 534 may be formed in a triangular or pear shape. The shape may comprise an initial side disposed adjacent the plurality of first openings 531 and expanding to a perimeter portion at an angle from 5° to 45°, for example, 11.25°. In one embodiment of the second opening 531, the second opening has about one-half the expansion angle of the first openings. The perimeter portion may be rounded or flat in shape. The second openings 524 may comprise from 4 to 48 openings, for example, 32 openings. Each of the second openings 524 may be position to correspond to one of the second openings 524 of the center manifold. Each second opening 524 may be adapted to have sufficient size to provide an opening encompassing all of the apertures for each respective second radial row of the upper manifold. The second openings 524 may be equally spaced from one another at equal angles. The second openings 534 may be provided at a ratio of first openings 531 to second openings 534 of 1:1 to 1:3, for example 1:2. In one example, the center manifold comprises 16 first openings expanding at an angle of 22.5° and 32 second openings at an angle of 11.25°.

The plurality of first gas channels 537 are disposed between the plurality of first openings 531, and may have the same number of channels 537 as the number of first openings 531. The gas channels have an inner portion which may be coupled to the center portion 533 of the manifold, an outer portion co-extensive with the first openings 531, and have a generally rectangular or square cross-section. Each of the plurality of first gas channels has one or more apertures, outlets, formed in one or more rows at the bottom thereof to provide fluid communication to a processing chamber. For example, each of the plurality of first gas channels has 10 apertures of 2 rows of five apertures each. The plurality of first gas channels 537 are adapted to contact a bottom surface of the center manifold, forming a sealed channel, and isolated from the openings 521 and 524 of the center manifold.

The plurality of second gas channels 538 are disposed between the plurality of second openings 534, and may have the same number of channels 538 as the number of second openings 534. The gas channels have an inner portion co-extensive with the inner portion of the second openings, an outer portion coupled to the channel network 539, and have a generally rectangular or square cross-section. Each of the plurality of second gas channels has one or more apertures, outlets, formed in one or more rows at the bottom thereof to provide fluid communication to a processing chamber. For example, each of the plurality of second gas channels has 10 apertures of 2 rows of five apertures each. The plurality of second gas channels 538 are adapted to contact a bottom surface of the center manifold, forming a sealed channel, and isolated from the openings 521 and 524 of the center manifold. The plurality of first gas channels 537 and the plurality of second gas channels 538 may be fluidly isolated from one another.

The channel network 539 is disposed concentrically around the plurality of second gas channels 538 and the plurality of second openings 534, and is fluidly coupled to the second gas channels 538. In one embodiment of the bottom manifold, each second gas channel 538 is coupled to the channel network 539. The channel provides a second fluid to the showerhead for delivery to a processing region of a processing chamber. The second fluid to the channel network may be the same or different fluid than the second fluid supplied through channel 518 to the plurality of first gas channels 537.

Referring to FIGS. 5E and 5F, a first fluid flows, $F_3$, such as a processing gas, through the showerhead via a second aperture 514 of the upper manifold, a second opening 524 in the center manifold, and a second opening 534 in the bottom manifold before entry into a processing region 550. A second fluid flows $F_4$, such as precursor, through channel 518 to a center 519, through the center 523 of the center manifold to the center 533 of the bottom manifold through one or more of the first gas channels 537 and apertures 542 and/or the second fluid (or a third fluid) flows through the channel network 539 to one or more of the second gas channels 538 and delivery to the processing region through apertures 542. Both the first fluid and the second fluid are isolated from one another in the showerhead until delivery into a processing chamber.

The embodiments described herein enable the delivery of two distinct fluids, such as gases, to a processing region without mixing until directly above the face of a substrate. The thermal control aspects provided herein also enable temperature control of the various gases provided to the processing region. This provides enhanced control of processes within the chamber, such as deposition, etch processes, and the like. For example, gas mixing may be controlled such that reactions in the processing region may be enhanced. Unwanted deposition on chamber components and particle generation may be minimized. This increases throughput by the reduction of particles and minimizing downtime for chamber cleaning.

It is believed that a dual zone gas showerhead as described herein allows separate process gas introduction into the process chamber to avoid any undesirable gas reactions and mixing prior to entering the process chamber. The dual zone showerhead provides better uniform gas distribution through independent gas introduction and control at center and at edge of the showerhead.

In an alternative embodiment, precursors may be introduced into the interior volume by more than one gas independent channels. The apertures regulating a first fluid flow from the first processing region, such as 215 to the second processing region, such as 233, ad the apertures regulating precursor flow may be adapted to provide any necessary configuration to provide center to edge multiple zone flow control. In such design, precursor flow and top flow can be introduced from both center and edge (even multiple zones), which can be controlled individually to control the final deposition profile. For example, such as limiting the number of apertures in a region over an outer portion of a substrate to direct flow over a center portion of a substrate. Under a dual-zone showerhead configuration, the precursor injection can be sectioned into two or more zones in radial direction and each zone has independent flow control.

Additionally, the invention contemplates a symmetric pumping liner having symmetric splits from chamber to foreline (first level channel has one port, and is connected to second level with 2 ports; each of the second level port connect to two ports on the third level, and so on, to the final pumping holes connected to the chamber). The final channel can be split into different sections or can be one connected channel. Its variations can skip one or several levels, for example from 4 to 32 etc but still keeps uniform pumping from the chamber by optimizing pumping hole size (hole diameter and slot length). The liner also eliminates gap between liner and C-channel, reducing the effect of slit valve opening.

While the foregoing is directed to embodiments of the present invention, other and further embodiments of the invention may be devised without departing from the basic scope thereof, and the scope thereof is determined by the claims that follow.

What is claimed is:

1. A gas distribution assembly, comprising:
    an annular body comprising:
        an annular ring having an inner annular wall positioned at an inner diameter, an outer wall positioned at an outer diameter, an upper surface, and a bottom surface;
        an upper recess formed into the upper surface;
        a lip formed radially outward of the inner annular wall; and a seat formed into the inner annular wall;
an upper plate positioned in the upper recess, comprising:
a disk-shaped body having a plurality of first apertures formed therethrough, wherein the first apertures extend beyond a surface of the body thereby forming raised cylindrical bodies; and
a bottom plate positioned on the seat, comprising:
a disk-shaped body having a plurality of second apertures formed therethrough which align with the first apertures; and
a plurality of third apertures formed between the second apertures and through the bottom plate, the bottom plate sealingly coupled to the upper plate to fluidly isolate the plurality of first and second apertures from the plurality of third apertures.

2. The gas distribution assembly of claim 1, wherein the upper plate and bottom plate are brazed together thereby forming a seal around each pair of aligned first and second apertures, wherein the upper plate is E-beam welded to the annular ring such that a seal is created between an outer edge of the upper plate and an inner edge of the upper recess, and wherein the bottom plate is E-beam welded to the annular ring such that a seal is created between an outer edge of the bottom plate and the inner annular wall.

3. The gas distribution assembly of claim 1, wherein the annular body further comprises:
a first cooling channel formed on the upper surface of the annular body radially outward of the upper recess; and
a second cooling channel is formed on the bottom surface of the annular body radially outward of the upper recess.

4. The gas distribution assembly of claim 3, wherein the annular body further comprises:
fluid delivery channels formed into the upper recess radially inward of the first cooling channel;
fluid passages formed into the upper recess radially inward of the fluid delivery channels, the fluid passages fluidly coupled to the fluid delivery channels; and
a conduit formed through the outer wall of the annular body and fluidly coupled to the fluid delivery channels, thereby forming a flow path from an inlet of the conduit to an outlet of the plurality of third apertures.

5. The gas distribution assembly of claim 1, wherein the annular body further comprises:
a heater recess formed in the bottom surface of the annular body radially outward of the second cooling channel.

6. The gas distribution assembly of claim 1, wherein at least a portion of each aperture of the plurality of first apertures and each aperture of the plurality of second apertures have a cylindrical shape.

7. The gas distribution assembly of claim 1, wherein the plurality of third apertures have an hourglass shape.

8. The gas distribution assembly of claim 1, wherein the plurality of second apertures and the plurality of third apertures form alternating staggered rows and wherein the each of the second apertures is separated from another second aperture by at least one third aperture.

9. A gas distribution assembly, comprising:
an annular body comprising:
an annular ring having an inner annular wall positioned at an inner diameter, an outer wall positioned at an outer diameter, an upper surface, and a bottom surface;
an upper recess formed into the upper surface;
a lip formed radially outward of the inner annular wall; and
a seat formed into the inner annular wall;
an upper plate positioned in the upper recess, comprising:
a disk-shaped body having a plurality of first apertures formed therethrough, wherein the first apertures extend beyond a surface of the body thereby forming raised cylindrical bodies; and
a bottom plate positioned on the seat, comprising:
a disk-shaped body having a plurality of second apertures formed therethrough which aligns with the first apertures, the second apertures arranged in a twelve sides polygonal pattern; and
a plurality of third apertures formed through the bottom plate, the third apertures having a diameter less than a diameter of the second apertures, each of the third apertures disposed between at least two second aperture, the bottom plate sealingly coupled to the upper plate in a manner that fluidly isolates the plurality of first and second apertures from the plurality of third apertures.

10. The gas distribution assembly of claim 9, wherein the upper plate and bottom plate are brazed together thereby forming a seal around each pair of aligned first and second apertures, wherein the upper plate is E-beam welded to the annular body such that a seal is created between an outer edge of the upper plate and an inner edge of the upper recess, and wherein the bottom plate is E-beam welded to the annular body such that a seal is created between an outer edge of the bottom plate and the inner annular wall.

11. The gas distribution assembly of claim 9, wherein the annular body further comprises:
a first cooling channel formed on the upper surface of the annular body radially outward of the upper recess; and
a second cooling channel formed on the bottom surface of the annular body radially outward of the upper recess.

12. The gas distribution assembly of claim 11, wherein the annular body further comprises:
fluid delivery channels formed into the upper recess radially inward of the first cooling channel;
fluid passages formed into the upper recess radially inward of the fluid delivery channels, the fluid passages fluidly coupled to the fluid delivery channels; and
a conduit formed through the outer wall of the annular body and fluidly coupled to the fluid delivery channels, thereby forming a flow path from an inlet of the conduit to an outlet of the plurality of third apertures.

13. The gas distribution assembly of claim 11, wherein the annular body further comprises:
a heater recess formed in the bottom surface of the annular body and radially outward of the second cooling channel.

14. The gas distribution assembly of claim 9, wherein the plurality of first apertures form a plurality of staggered rows, and wherein the plurality of second apertures and the plurality of third apertures form alternating staggered rows and wherein the each of the second apertures is separated from another second aperture by at least one third aperture.

15. The gas distribution assembly of claim 1, wherein the upper plate is configured to be exposed to a plasma region facing a processing chamber lid.

16. The gas distribution assembly of claim 9, wherein the upper plate is configured to be exposed to a plasma region facing a processing chamber lid.

* * * * *

UNITED STATES PATENT AND TRADEMARK OFFICE
CERTIFICATE OF CORRECTION

PATENT NO. : 8,894,767 B2
APPLICATION NO. : 12/836726
DATED : November 25, 2014
INVENTOR(S) : Chuc et al.

It is certified that error appears in the above-identified patent and that said Letters Patent is hereby corrected as shown below:

In the Specification:

Column 9, Line 36, please delete "then" and insert -- than -- therefor;

Column 9, Line 40, please delete "then" and insert -- than -- therefor;

Column 11, Line 49, please delete "grater" and insert -- greater -- therefor;

Column 12, Line 25, please delete "grater" and insert -- greater -- therefor;

Column 16, Line 28, please delete "ad" and insert -- and -- therefor.

Signed and Sealed this
Twelfth Day of May, 2015

Michelle K. Lee
*Director of the United States Patent and Trademark Office*